(12) United States Patent
Yang et al.

(10) Patent No.: US 8,176,401 B1
(45) Date of Patent: May 8, 2012

(54) DECODING METHODS AND APPARATUS FOR FRACTIONAL MULTIDIMENSIONAL TRELLIS CODED MODULATION SYSTEMS

(75) Inventors: Xueshi Yang, Sunnyvale, CA (US); Gregory Burd, San Jose, CA (US)

(73) Assignee: Marvell International Ltd., Hamilton (BM)

(*) Notice: Subject to any disclaimer, the term of this patent is extended or adjusted under 35 U.S.C. 154(b) by 1094 days.

(21) Appl. No.: 12/021,951

(22) Filed: Jan. 29, 2008

Related U.S. Application Data

(60) Provisional application No. 60/889,117, filed on Feb. 9, 2007.

(51) Int. Cl.
*H03M 13/03* (2006.01)

(52) U.S. Cl. ........ 714/792; 714/786; 714/789; 375/265; 375/298

(58) Field of Classification Search .................. 714/792, 714/786, 789; 375/265, 298, 254
See application file for complete search history.

(56) References Cited

U.S. PATENT DOCUMENTS

| 5,010,401 A | * | 4/1991 | Murakami et al. | ........ 375/240.16 |
| 7,848,142 B2 | * | 12/2010 | Radke | ...................... 365/185.03 |

OTHER PUBLICATIONS

Lin et al. "Trellis-Coded Modulation" Error Control Coding Fundamentals and Applications Second Edition, Chapter 18 pp. 952-1062.
Ungerboeck "Channel Coding with Multilevel/Phase Signals" IEEE Transactions on Information Theory, vol. IT-28, No. 1, pp. 55-67, Jan. 1982.

* cited by examiner

*Primary Examiner* — Fritz Alphonse

(57) ABSTRACT

Systems and methods for encoding user information and decoding signal vectors using fractional encoding/decoding and set partitioning. A fractional encoder can select a coset for transmitting or storing user information based on one or more deterministic bits and on encoded user information. The deterministic bits limit the encoder to using only a subset of the available signal vectors in a modulation scheme. A fractional decoder can receive a signal vector, and can find at least two nearest neighbors in each dimension. The fractional decoder can form a set of potential signal vectors using only the at least two nearest neighbors. The decoder may determine which of these potential signal vectors are valid within the fractional signaling scheme, and can decode the received signal vector based on the valid potential signal vectors.

30 Claims, 21 Drawing Sheets

DECODING METHODS AND APPARATUS FOR FRACTIONAL MULTIDIMENSIONAL TRELLIS CODED MODULATION SYSTEMS

CROSS-REFERENCE TO RELATED APPLICATIONS

This claims the benefit under 35 U.S.C. §119(e) of U.S. Provisional Application No. 60/889,117 filed Feb. 9, 2007, which is hereby incorporated by reference herein in its entirety.

BACKGROUND OF THE DISCLOSURE

The disclosed technology relates generally to bandwidth efficient communications or storage systems, and more particularly, to systems and methods for encoding and decoding signal vectors based on a fractional signaling scheme in a bandwidth efficient communications or storage system.

To improve the reliability of communications and storage systems, error control coding is commonly applied to the information that is conveyed or stored. A suitable error correcting code (ECC) can be applied to the information, which adds redundancy to the data stream. If the same throughput of information or storage space is desired in communication/storage, bandwidth expansion is often necessary. Bandwidth expansion refers to an increase in channel bandwidth, typically to allow transmission or storage to occur through the channel with a reduced symbol period or increased storage density. For some channels, especially for those that are low in quality, bandwidth expansion may not be possible or may not be desirable. In these situations, rather than increasing the needed bandwidth, the communication or storage system can utilize modulation schemes with a greater number of signal constellation points. For communications systems, this technique allows for more information to be transmitted at any given time. For example, signaling schemes that double the number of signal constellation points used for transmission, which therefore doubles the amount of information transmitted each symbol period, may produce substantially the same throughput as a signaling scheme that maintains the modulation scheme and doubles the channel bandwidth.

To fully utilize the advantages provided by increasing the number of signal constellation points, the type of modulation and the type of error correcting code should be designed to operate effectively together. This type of data encoding is typically referred to as coded modulation. When a convolutional code is used for the error correcting code, the system implements trellis coded modulation (TCM), and when a block code is used, the system implements block coded modulation (BCM).

However, by increasing the number of signal constellation points, neighboring signal constellation points may be brought closer together. For example, the voltage difference between neighboring signal constellation points may be made relatively small as signal constellation points are added to the modulation scheme. Therefore, the communications or storage system may be more susceptible to channel noise and other disturbances.

SUMMARY OF THE DISCLOSURE

In general, in one aspect, systems and methods are provided for encoding user information and decoding signal vectors in a bandwidth efficient communications or storage system based on a fractional signaling scheme, where the fractional signaling scheme uses at most half of the available signal vector combinations in a multi-dimensional modulation scheme.

As used herein, a "signal vector" refers to any signals (or signal) transmitted or received using a modulation scheme with a multi-dimensional signal constellation set (e.g., $(8PAM)2$, $(8PAM)4$, QAM). The term, signal vector, will be used regardless of whether the dimensions are implemented spatially, temporally, or in frequency.

A "signal level" refers to an amplitude, phase, or other value associated with a one-dimensional (1D) signal or a 1D signal component of a multi-dimensional signal vector. A "signal constellation point," a "signal point," or a "test point" refers to a signal level in a 1D signal constellation set or a 1D component of a multi-dimensional signal constellation set. Thus, an 8PAM signal constellation set has eight signal points, each having a different signal level.

Finally, a "signal point vector," or a "test vector," refers to a multi-dimensional signal vector, where each component of the multi-dimensional vector is associated with a 1D signal constellation set and takes a value of a signal point in that 1D signal constellation set. Thus, a signal point vector for an $(8PAM)^4$ signal constellation set would include four dimensions, and each dimension would take on the value of an 8PAM signal point. Also, each signal vector transmitted or received in the digital communication or storage system may be derived from one of the signal point vectors based on the digital information that is conveyed or stored.

A communications or storage system can include a TCM or BCM encoder for transmitting or storing information as a signal vector, and a TCM or BCM decoder for receiving the signal vector from a channel separating the encoder and decoder. The signal vector may have any number of dimensions, where each signal component of the signal vector can be multi-level. For example, the TCM/BCM encoder and decoder may communicate using an $(8PAM)^4$ modulation scheme. In this scenario, the encoder and decoder utilize four-dimensional signal vectors made up of signals with eight levels.

An encoder in accordance with an embodiment of the present invention can employ set partitioning and fractional encoding/signaling to encode user information. The potential signal vectors used by the encoder to transmit or store the user information can be grouped into cosets. For example, for an 8PAM scheme with eight signal constellation points, the signals may be grouped into four cosets, each with two signal constellation points. The encoder can first select one of the cosets based on a subset of the user information. This subset of user information may first have been encoded by an error correcting code (ECC) encoder, such as a convolutional code encoder. The ECC-encoded subset of user information may be referred to as coset information, since it is used to identify the coset. In addition to the coset information, the encoder can select the coset based on one or more deterministic bits that are fixed to, for example, zero. Because these deterministic bits are fixed and cannot take on the opposite value (e.g., one), the encoder is limited to selecting from at most half of the available cosets in the multi-dimensional modulation scheme.

The encoder may then select channel domain information from within the selected coset. The encoder may select the channel domain information based on the remaining user information that was not encoded into coset information. The channel domain information may be formatted for modulation using the multi-dimensional modulation scheme and can be transmitted or stored as a multi-dimensional signal vector. The multi-dimensional signal vector can include a representation of the coset information, the one or more deterministic bits, and the remaining user information, where all of this information may be mapped from their original values to the channel domain according to a coset generator matrix. The deterministic bits may be mapped into at least the least significant bit of each signal component in the multi-dimensional signal vector. The coset information may also be mapped into at least the least significant bit of each signal component.

The multi-dimensional signal vector transmitted or stored by the encoder can be received by a decoder for decoding. A decoder in accordance with an embodiment of the present invention can decode a received multi-dimensional signal vector that was encoded using fractional signaling and set partitioning. The decoder may find at least two nearest neighbors in each dimension of the received signal vector, where a nearest neighbor refers to a signal point that is amongst the closest signal constellation points to a signal value in one dimension of the received signal vector. The decoder can form a set of potential signal vectors that include signal points only from the discovered nearest neighbors. The potential signal vectors may sometimes be referred to as test vectors. The decoder may then determine which of the test vectors are valid in the fractional signaling scheme. The decoder may compute branch metrics using the valid test vectors. These branch metrics may be assigned to branches of a trellis diagram, and a Viterbi add-compare-select (ACS) unit may detect which coset that the received signal vector belongs in.

In another embodiment of the present invention, the decoder can form a first set of test vectors using a first set of nearest neighbors, where the first set of test vectors is not sufficient to populate the branches of the trellis diagram with branch metrics. That is, once the decoder validates the test vectors in the first set, the number of valid test vectors may not be sufficient to compute branch metrics for all the branches. The decoder can make up for the deficiency by producing a second set of test vectors that are valid. The decoder can, for example, alter the valid test vectors from the first set to obtain the second set of valid test vectors. For each valid signal vector in the first set, the decoder may change a signal point in one signal component (e.g., one dimension) of the valid signal vector. That is, the decoder may obtain a test vector for the second set from a valid test vector in the first set by replacing a signal point in the valid test vector with another nearest neighbor in the same dimension, and retaining the signal points in all the other dimensions of the valid test vector.

Thus, in some embodiments of the present invention, a fractional encoder is provided for encoding user domain information to produce channel domain information, where the channel domain information may be grouped into a plurality of cosets, and where the user domain information may be grouped into a first group and a second group. The fractional encoder can include means for encoding the first group of user domain information to produce coded information and means for selecting one of the cosets based on the coded information and on deterministic information that does not vary based on the user domain information or the coded information (e.g., one or more bits that are fixed to zero or one). To produce the channel domain information, the fractional encoder can further include means for selecting the channel domain information based on the selected coset and the second group of user domain information. The fractional encoder may include means for mapping the coded information and the second group of user domain information into the channel domain information using a coset generator matrix.

In some embodiments, the fractional encoder can include means for modulating the channel domain information using a multi-level modulation scheme, where the means for modulating the channel domain information uses at most half of the available signal point vectors in the multi-level modulation scheme. The deterministic information can be mapped into at the least significant bit of each dimension in the multi-dimensional modulation scheme.

In other embodiments of the present invention, a fractional decoder is provided for decoding a received signal vector modulated using a signaling scheme based on a multi-dimensional modulation scheme, where the signaling scheme uses at most half of available signal point vectors in the multi-dimensional modulation scheme. The fractional decoder can include means for identifying at least two nearest neighbors in each dimension of the received signal vector. The fractional decoder can further include means for validating each of a plurality of potential signal vectors to produce a set of valid potential signal vectors, where the potential signal vectors are grouped into cosets and include signal points formed only from the at least two nearest neighbors in each dimension. The means for validating can, among other things, determine whether each potential signal vector is a signal point vector that is part of the signaling scheme. The fractional decoder may then identify one of the cosets based on the valid potential signal vectors to produce an estimate of the received signal vector.

In some embodiments, the means for validating in the fractional decoder may include means for reverse mapping each potential signal vector from a channel domain to a coded domain, and means for determining whether each of the mapped potential signal vectors in the coded domain satisfies a constraint. The constraint may be satisfied for one of the mapped potential signal vectors when, for example, that mapped potential signal vector includes a particular value for at least one bit. In some embodiments, the means for validating can additionally or alternatively include means for determining whether a particular set of bits in each potential signal vector satisfies a constraint (e.g., a parity constraint).

The fractional decoder may identify one of the cosets using a trellis diagram. The trellis diagram may be matched to a convolutional code that corresponds to the code used by a corresponding encoder. For example, the fractional encoder may include means for computing branch metrics based on at least a subset of the set of valid potential signal vectors. The means for computing branch metrics may compute Euclidean-distance based branch metrics based on a Euclidean distance or squared Euclidean distance between each valid potential signal vector and the received signal vector. To use the computed branch metrics, the fractional decoder can also include means for determining a path through the trellis diagram (e.g., a Viterbi add-compare-select unit). Each branch of the path selected by this means can correspond to an identified coset.

In another embodiment of the present invention, a branch metric computation unit is provided for computing branch metrics. The branch metrics may be used to decode a received signal vector that was modulated using a signaling scheme based on a multi-dimensional modulation scheme, where the signaling scheme uses at most half of available signal point vectors in the multi-dimensional modulation scheme. The branch metric computation unit can calculate branch metrics based on a first set of nearest neighbors of the received signal vector and on a second set of nearest neighbors, where the second set includes signal points further from the received signal vector than corresponding signal points in the first set. The branch metric computation unit can include means for validating each of a plurality of potential signal vectors to produce a first group of valid potential signal vectors, where the potential signal vectors include signal points formed only from the first set of nearest neighbors. The means for validating can include, for example, means for determining whether each potential signal vector is a signal point vector that is part of the signaling scheme.

To produce a second group of valid potential signal vectors, the branch metric computation unit can further include means for altering the valid potential signal vectors in the first group, wherein each valid potential signal vector in the second group includes at least one nearest neighbor in the second set of nearest neighbors. The means for altering can alter the valid potential signal vectors in the first group by changing one of the signal points in a valid potential signal point in the first group to a nearest neighbor in the second set having the same least significant bit as the one of the signal points. The branch metric computation unit may include means for computing a plurality of branch metrics based on the first and second group of valid potential signal vectors.

To alter the valid potential signal vectors in the first group, the means for altering can include, for each valid potential signal vector in the first group, means for replacing a first signal point in a first dimension of the valid potential signal vector with a nearest neighbor in the second set from the first dimension to produce a first altered valid potential signal vector. The means for altering can include means for computing a first delta difference based on a Euclidean distance between the first signal point and the signal point replacing the first signal point. Also, the means for altering may include means for replacing a second signal point in a second dimension of the valid potential signal vector with a nearest neighbor in the second set from the second dimension to produce a second altered valid potential signal vector, and means for computing a second delta difference based on a Euclidean distance between the second signal point and the signal point replacing the second signal point. The means for altering may then select the first altered valid potential signal vector to include in the second group of valid potential signal vectors when the first delta distance is smaller than the second delta distance, or can otherwise choose the second altered valid potential signal vector.

BRIEF DESCRIPTION OF THE DRAWINGS

The above and other aspects and advantages of the invention will be apparent upon consideration of the following detailed description, taken in conjunction with the accompanying drawings, in which like reference characters refer to like parts throughout, and in which.

DETAILED DESCRIPTION OF THE INVENTION

Figure 1:
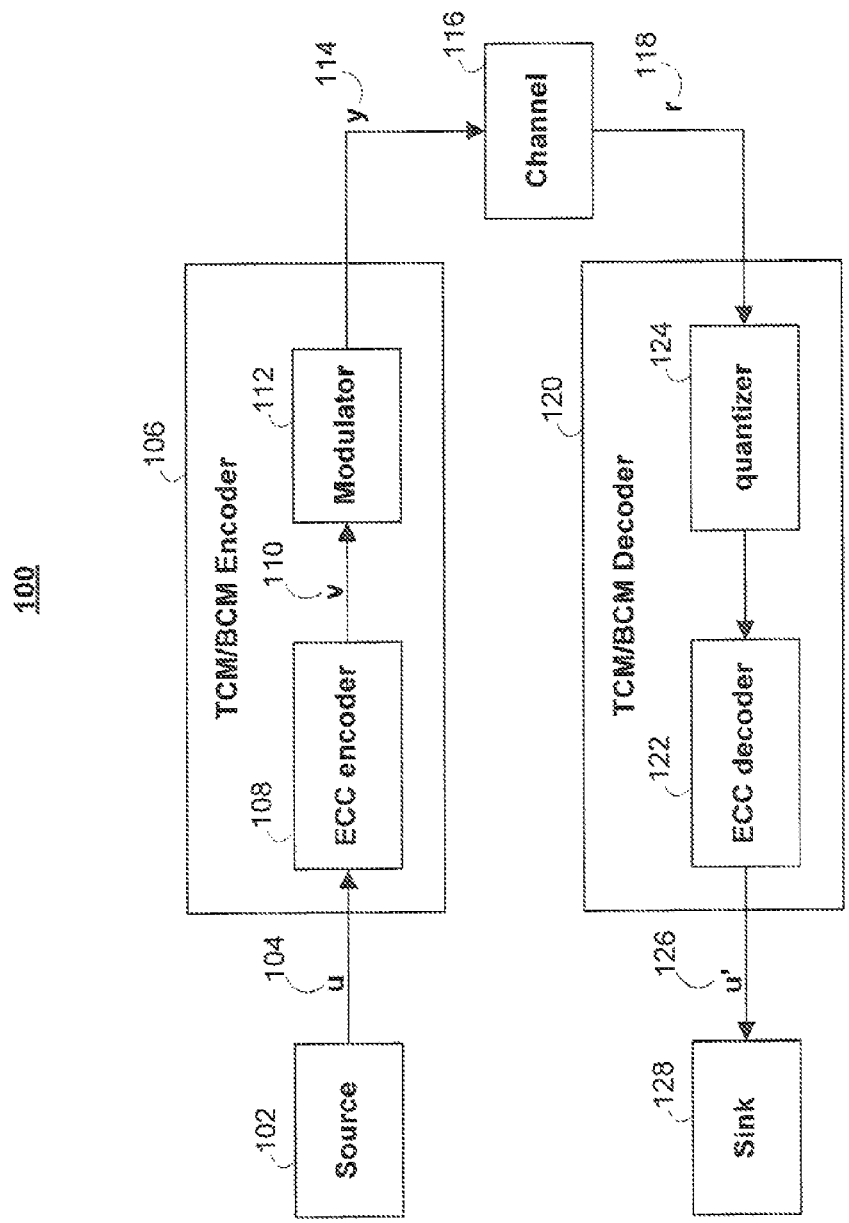
FIG. 1 shows a simplified block diagram of a data communications or storage system.

FIG. 1 shows a simplified block diagram of communications or storage system 100. Digital communications or storage system 100 can include source 102, TCM/BCM encoder 106, channel 116, TCM/BCM decoder 120, and sink 128. System 100 may be used to transfer user information 104, referred to sometimes by the symbol u, from source 102 to sink 128. Source 102 may be any suitable source that can provide user information 104. For example, source 102 may be, but is not limited to, a source encoder, an error-correcting/error-detecting code encoder (e.g., a convolutional code encoder, a Reed-Solomon encoder, a CRC encoder, an LDPC encoder, a Turbo code encoder, etc.), or a storage device. User information 104 provided from source 102 to sink 128 can represent any type of information to be conveyed (e.g., a sampled/quantized version of an analog signal, binary information, etc.) and can be in any suitable digital form (e.g., encoded data, uncoded data, etc.).

User information 104 may be transferred from source 102 to sink 128 using one or more information-carrying signals. The information-carrying signals may be transferred through a transmission or storage medium that degrades the signals. The effect of this signal-altering medium is represented in FIG. 1 by channel 116. Channel 116 may represent any suitable storage medium in which user information 104 is stored, such as a magnetic storage device (e.g., a hard disk), an electrical storage device (e.g., FLASH memory or RAM), or an optical storage device (e.g., a CD-ROM). Alternatively, channel 116 may represent any suitable wired or wireless transmission medium through which user information 104 is conveyed. The communications or storage medium may also cause the information-carrying signals to be affected by additive signal-dependent or signal-independent noise. In some embodiments, the noise of channel 116 may be modeled as additive white Gaussian noise (AWGN).

Due to the effects of channel 116 on the information-carrying signals, reliable information transfer may be obtained from TCM/BCM encoder 106 and TCM/BCM decoder 120. TCM/BCM encoder 106 may prepare user information 104 obtained from source 102 for transmission through channel 116. The resulting information-carrying signal or signal vector is referred to herein by the symbol y. TCM/BCM encoder 106 may encode user information 104 based on any suitable convolutional code (for TCM) or block code (for BCM). For example, TCM/BCM encoder 106 may encode user information 104 based on a suitable rate-½ or rate-⅔ convolutional code, or a suitable (n, k, d) block code. This function of TCM/BCM encoder is embodied in convolutional/block encoder 108, which produces coded information 110. A coded information sequence may sometimes be referred to by the symbol v.

In addition to coding, TCM/BCM encoder 106 may include modulator 112 for modulating coded information 110. Modulator 112 may convert coded information 110 to signal or signal vector 114 based on a suitable modulation scheme. Signal or signal vector 114 may be referred to herein by the symbol, y. The modulation scheme applied by modulator 112 to produce signal or signal vector 114 may be a binary-level scheme, such as 2PAM, or a multi-level modulation scheme, such as 4PAM, 8PAM, 16PAM, or 64PAM. Other suitable modulation schemes that TCM/BCM encoder 106 may utilize include an M-level QAM, PSK, or ODFM scheme. In general, TCM/BCM encoder 106 may modulate coded information 110 based on signal constellation sets of one or more dimensions (e.g., a 2D $(8PAM)^2$ set, a 4D $(8PAM)^4$ set). The dimensions can be implemented spatially (e.g., for MIMO systems), in frequency (e.g., orthogonal carrier frequencies), in time (e.g., sequentially), or using a combination of these.

The coding and modulation techniques implemented by encoder 108 and modulator 112, respectively, may be designed to operate effectively together. This design approach is typically referred to as coded modulation, and is a type of bandwidth efficient communication. That is, coded modulation may not require bandwidth expansion to maintain the same throughput as transferring uncoded user information, even though redundancy is added to the information stream. In some embodiments, rather than having a separate ECC encoder and modulator, as shown in FIG. 1, a TCM/BCM encoder may integrate these functions into a single component. Also, although encoder 106 is shown to utilize trellis coded modulation (TCM) or block coded modulation (BCM), it should be understood that encoder 106 may alternatively utilize another bandwidth efficient technique.

With continuing reference to FIG. 1, because of the effects of channel 116, signal or signal vector 118 received by TCM/BCM decoder 120 (referred to sometimes by the symbol, r) may be a distorted or noisy version of signal or signal vector 114. TCM/BCM decoder 120 can interpret signal vector 118 and can attempt to recover user information 104 from signal vector 118. Estimate 126 of TCM/BCM decoder 120 may be any suitable estimate of user information 104. For example, estimate 126 may be a hard bit estimate of user information 104 or may be a soft estimate (e.g., in the form of LLRs). To obtain estimate 126, TCM/BCM decoder 120 may include quantizer 124 and convolutional/block decoder 122. These components may be matched to their corresponding components in TCM/BCM encoder 106. For example, if ECC encoder 108 is a rate-½ convolutional code encoder, ECC decoder 108 may be a Viterbi-based decoder matched to the rate-½ convolutional code. In some embodiments, ECC decoder 122 and quantizer 124 may be combined into a single unit.

TCM/BCM encoder 106 and TCM/BCM decoder 120 may employ fractional encoding and decoding, respectively. That is, TCM/BCM encoder 106 and TCM/BCM decoder 120 may operate using only a subset of the available signal points or signal point vectors in a given modulation scheme. For example, if TCM/BCM encoder 106 and TCM/BCM decoder 120 employ $(8PAM)^2$ signaling, which typically provides signaling based on $8^2=64$ potential signal point vectors, TCM/BCM encoder 106 and TCM/BCM decoder 120 may transit signal vectors using only 32 of these potential signal point vectors. For simplicity, a signaling scheme that uses half of the signal points or signal point vectors in an $(8PAM)^2$ modulation scheme may be referred to as an $(8PAM)^2/2$ scheme, and a signaling scheme that uses a quarter of the signal points in an $(8PAM)^2$ modulation scheme may be referred to as an $(8PAM)^2/4$ scheme. Similar conventions may be applied to refer to fractional signaling using other modulation schemes (e.g., QAM, PSK, etc.) and other fractions (e.g., ⅛, 1/16, ⅓).

TCM/BCM encoder 106 and TCM/BCM decoder 120 may also employ a communications or storage approach referred to as set partitioning. Set partitioning can refer to a technique that separates the signal points or signal point vectors in a modulation scheme (e.g., the eight points in 8PAM) into separate groups. These groups may be referred to as cosets. For an 8PAM scheme, for example, TCM/BCM encoder 106 and TCM/BCM decoder 120 may operate based on four cosets that each includes two signal points. To encode user information 104, TCM/BCM encoder 106 may first select the coset that user information 104 belongs in, and may then select the particular signal point from within the coset. Similarly, to decode received signal vector 118, TCM/BCM decoder 120 may first identify which coset the information contained within received signal vector 118 belongs in, and then may provide an estimate based on a signal point or signal point vector in the identified coset.

More detailed embodiments of TCM encoders capable of operating based on fractional encoding and set partitioning will be described below in greater detail in connection with FIGS. 5-8. Likewise, more detailed embodiments of TCM decoders capable of operating based on fractional decoding and set partitioning will be described below in greater detail in connection with FIGS. 9-17. However, in order to simplify the description of these figures, a more detailed description of set partitioning will first be presented in connection with FIGS. 2-4.

Figure 2:
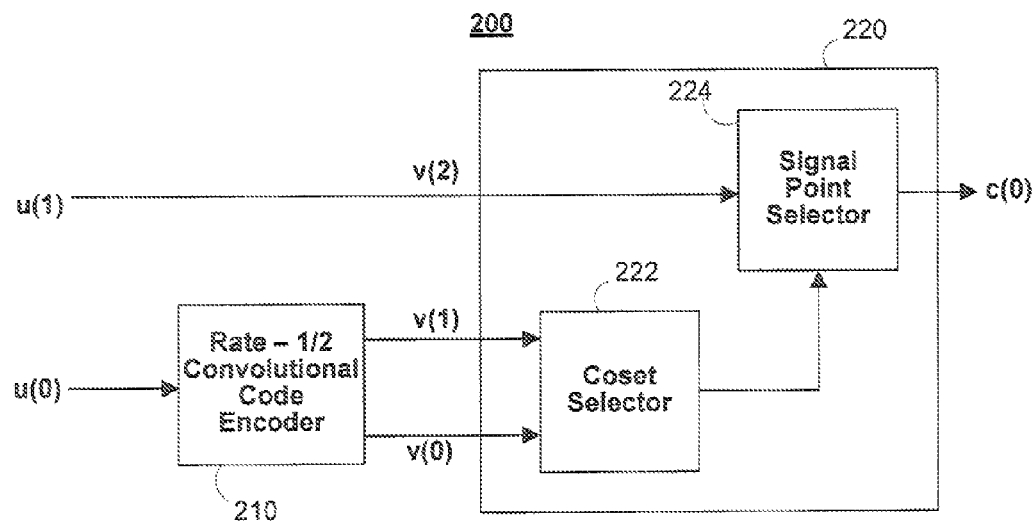
FIGS. 2 and 3 show simplified block diagrams of TCM encoders.

FIG. 2 shows a simplified block diagram of TCM encoder 200 that operates based on the principles of set partitioning. TCM encoder 200 may be one embodiment of TCM/BCM encoder 106 in FIG. 1, and may be configured to convert two uncoded user data bits, u(0) and u(1), into a three-bit output, c(0), that can be transmitted as one 8PAM signal. To perform this conversion, TCM encoder 200 can include rate-½ convolutional code encoder 210 and signal mapper 220. Rate-½ convolutional code encoder 210 may encode u(0) based on any of a variety of suitable rate-½ convolutional codes to produce two encoded outputs, v(0) and v(1). Thus, three inputs may be provided to signal mapper 220, where two of the inputs, e.g., v(0) and v(1), may be coded, while the remaining one input, e.g., v(2)=u(1), may be uncoded user information.

Signal mapper 220 may prepare its three inputs, collectively referred to as v, for storage or transmission, and may therefore complete at least some of the functions of a modulator (e.g., modulator 112 of FIG. 1). Signal mapper 220 may include coset selector 222 and signal point selector 224 for performing the set partitioning operations briefly discussed above. Coset selector 222 can select a particular coset based on the values of the coded information, v(0) and v(1). As v(0) and v(1) can take on four different combinations, coset selector 222 may be operable to select between four different cosets. From the coset information provided by coset selector 222, signal point selector 224 may select a particular signal point from within the coset. Signal point selector 224 may select the signal point based on the value of the uncoded data, v(2), and therefore may select between two different signal points in the coset. The value of the signal point selected by signal point selector 224 may be provided as a vector output, c(0). In some embodiments, c(0) may include three binary entries, which allows c(0) to be converted to an 8PAM signal.

Figure 3:
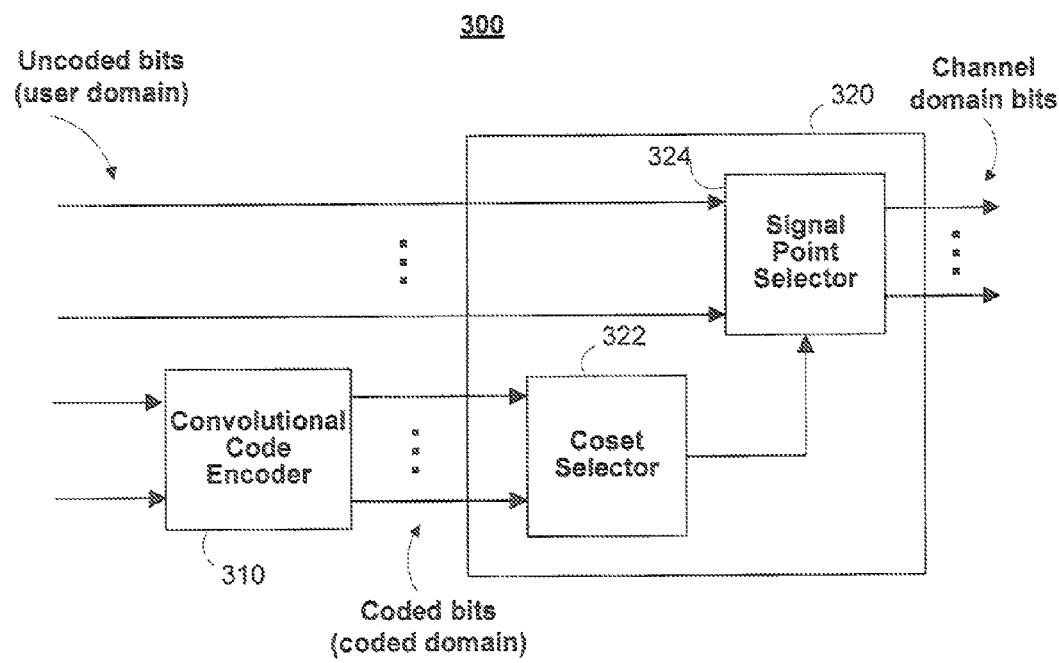

A general view of an encoder, such as TCM encoder 200 of FIG. 2, is illustrated in FIG. 3. That is, FIG. 3 shows a simplified block diagram of TCM encoder 300 that can convert any suitable number of user information bits into one or more corresponding output vectors. The output vectors may therefore be modulated using a single or multi-dimensional modulation scheme. Like in FIG. 2, TCM encoder 300 can include convolutional code encoder 310 and signal mapper 320, where signal mapper 320 in turn can include coset selector 322 and signal point selector 324. Any of these components may have any of the features and functionalities of corresponding components from FIG. 2.

Encoder 300 can convert any suitable number of uncoded bits to signals based on a set partitioning approach. The uncoded user information bits may sometimes be referred to as bits in a user domain. A subset of the uncoded bits may be encoded by convolutional code encoder 310, which may encode this subset based on any suitable convolutional code (e.g., rate-½, rate-⅔, rate-⅗ convolutional code, and so on). The resulting encoded bits, as well as those that remain uncoded, may be provided to signal mapper 320. The bits, v, provided to signal mapper 320 may sometimes be referred to as coded domain bits. Coset selector 322 can identify a coset based on the encoded bits obtained from convolutional code encoder 310. Thus, the greater the number of coded bits provided to coset selector 322, the greater the number of cosets coset selector 322 can select from. Using the coset selected by coset selector 322, signal point selector 324 may identify a signal point or signal point vector in the coset from the bits remaining in the uncoded domain. Thus, similarly, the greater the number of uncoded bits that are not encoded by encoder 310, the greater the number of signal points there may be in each coset. Signal point selector 324 may then provide vector outputs that may be referred to as being in a channel domain. Signal point selector 324 may provide multiple vector outputs, where each output may correspond to a different binary or multi-level signal. For example, each vector output may be a three-bit output that can be converted to an 8PAM signal or one dimension of an $(8PAM)^4$ signal vector.

Figure 4:
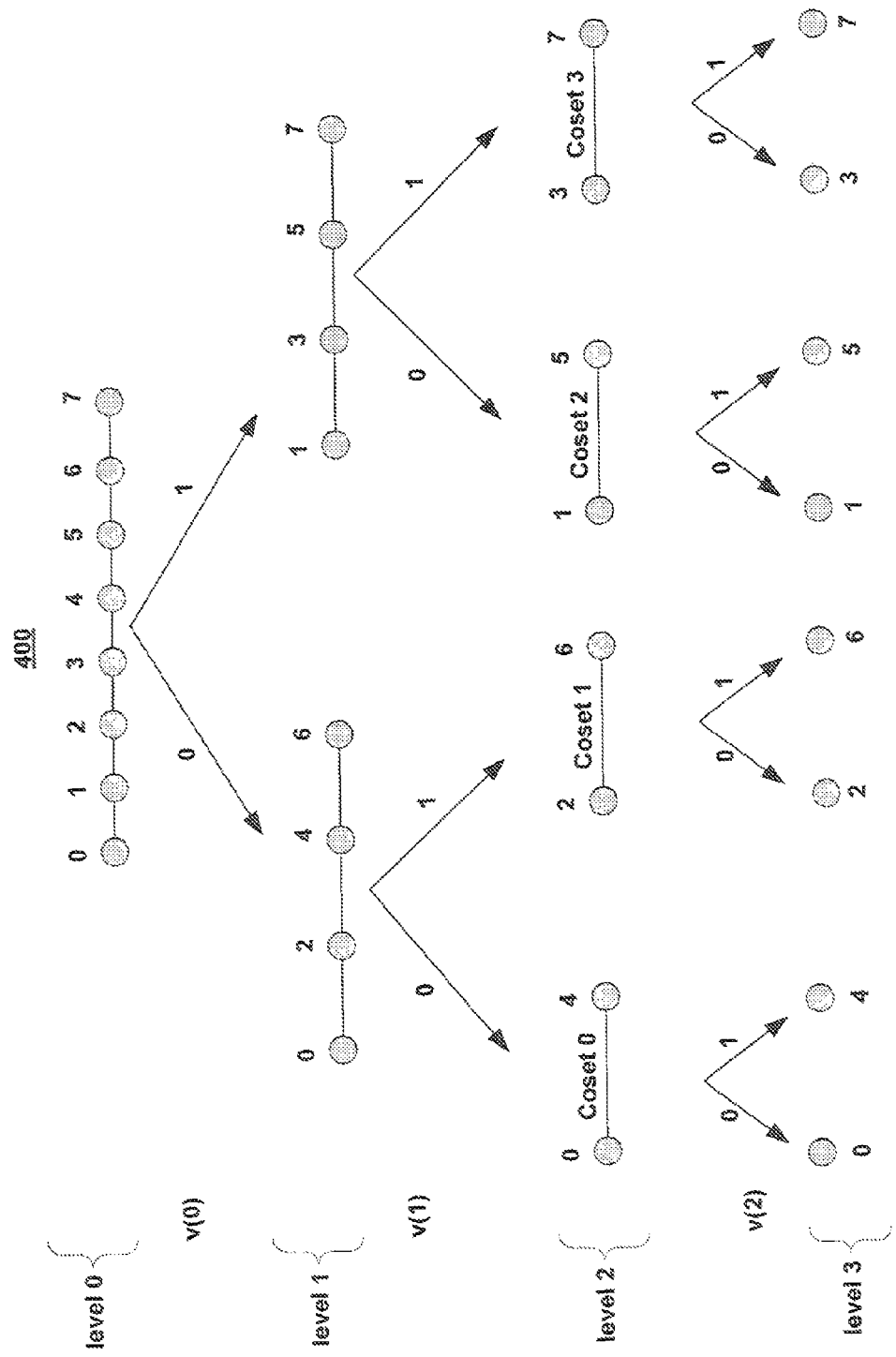
FIG. 4 shows a tree diagram that illustrates set partitioning.

FIG. 4 shows tree diagram 400 that illustrates set partitioning for an 8PAM signal set. Tree diagram 400 may represent the set partitioning approach employed by encoder 200 of FIG. 2 to obtain an 8PAM signal. In particular, tree diagram 400 illustrates a scenario where v(0) and v(1) are used to select a coset and v(2) is used to select a signal point within the selected coset. Tree diagram 400 can include four levels, level 0 through level 3. Level 0 includes all eight signal points of the 8PAM signal set, labeled as signal points 0 through 7 from the leftmost signal point to the rightmost signal point. The 8PAM signal set is repeatedly divided in successive levels, producing an increasing number of cosets at each stage and with increasing Euclidean distance (or squared Euclidean distance) between the signal points. For example, the intra-coset distance between neighboring points 0 and 1 in a coset of level 0 may be $\|1-0\|^2=1$, while the intra-coset distance between neighboring points 0 and 2 of level 1 may be $\|2-0\|^2=4$.

The values of v(0) and v(1), which may be outputs of convolutional code encoder 210 of FIG. 2, can specify a particular path through tree diagram 400 to a particular coset in level 2. Thus, based on these values, one of the four cosets, coset 0 through coset 3, may be selected. For example, if v(0)=0 and v(1)=1, coset 1 may be selected. If v(0)=1 and v(1)=0, coset 2 may be selected. This selection process may represent the operations performed by coset selector 222 of FIG. 2. Thus, as described above, coset selector 222 may effectively select one of the four cosets in FIG. 4 by traversing a path through a tree diagram such as tree diagram 400.

With continued reference to FIG. 4, the final bit in the coded domain, or v(2), may be used to select a signal point from the selected coset. That is, the values of v(0) and v(1) may bring the path through tree diagram 400 to a coset in level 2, while the value of v(2) may allow the path to continue to a signal point in level 3. This selection operation may represent the operation performed by signal point selector 224, described above in connection with FIG. 2. Thus, as described above, signal point selector 224 may effectively select a signal point by completing a path through a tree diagram, such as tree diagram 400.

Further features of set partitioning, as well as encoders and decoders that can employ set partitioning, are described in greater detail in U.S. patent application Ser. No. 12/014,556, filed Jan. 15, 2008 (hereinafter "the Burd application"), which is hereby incorporated by reference in its entirety.

Figure 5:
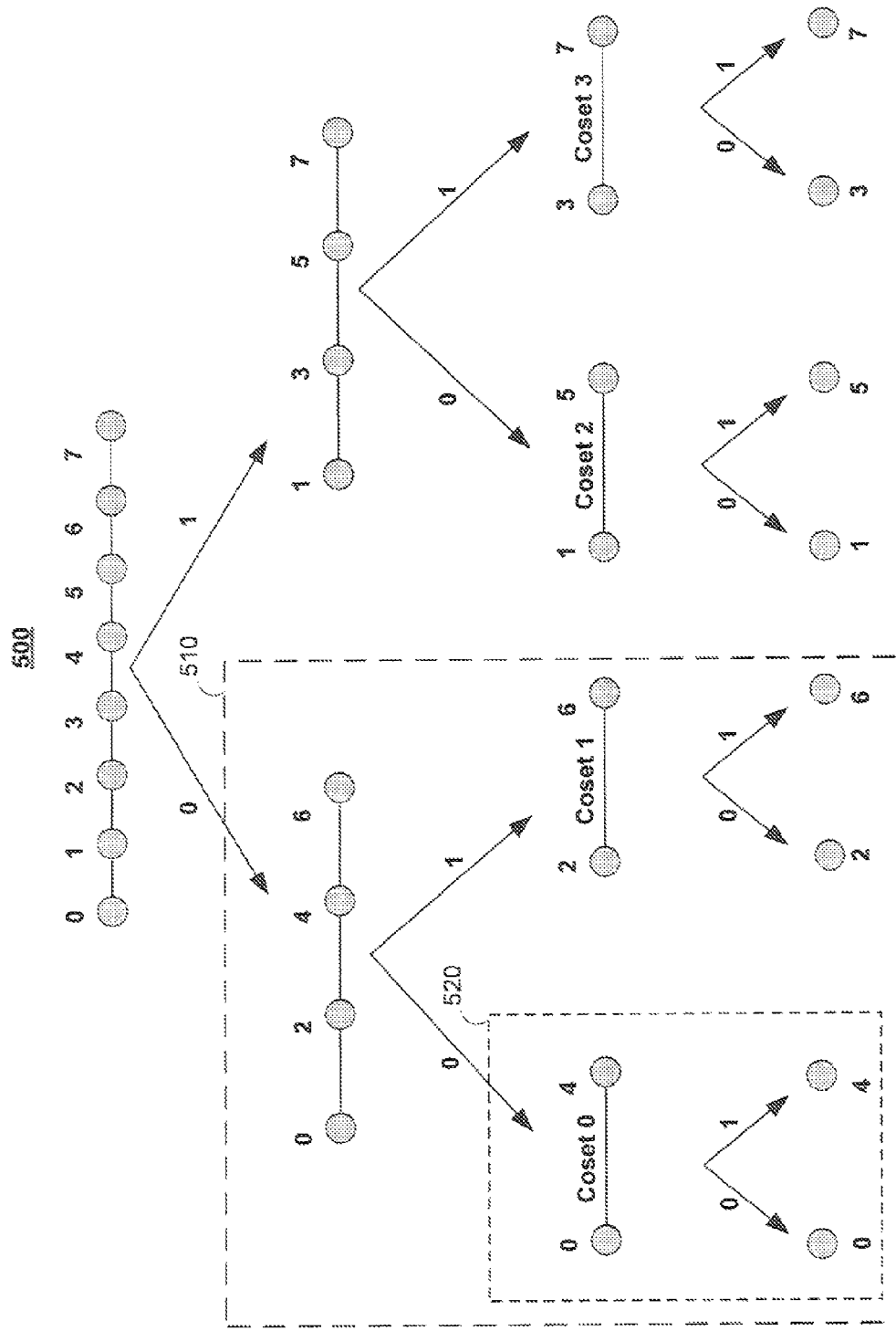
FIG. 5 shows the tree diagram of FIG. 4 and illustrates subsets of signal points used by various fractional TCM encoders and decoders.

As described above, an encoder and decoder in accordance with an embodiment of the present invention, such as TCM/BCM encoder 106 and TCM/BCM decoder 120, can employ fractional signaling. In particular, the encoder and decoder may not use all of the signal points or signal point vectors that are available in a modulation scheme. For example, rather than using all eight signal points in an 8PAM signal set, a fractional encoder and decoder may use only two or four of the signal points. FIG. 5 shows tree diagram 500 that can illustrate the effect of employing fractional signaling. Tree diagram 500 may be substantially similar to tree diagram 400 described above in connection with FIG. 4.

Instead of allowing a coset selector (e.g., coset selector 222 of FIG. 2) to traverse any path through tree diagram 500, the coset selector may be limited to traversing only specific paths. For example, in some embodiments, the coset selector may be limited to the paths with signal points included within region 510. To limit the number of paths, v(0) may be fixed to zero such that a path where v(0)=1 cannot be traversed. This prevents half of the signal points—1, 5, 3, and 7—from being used in the signaling scheme. Similarly, half of the available cosets—2 and 3—may not be selected by the coset selector. This signaling scheme may therefore be referred to as an 8PAM/2 scheme.

In other embodiments, the coset selector may limit the paths to those included within region 520. In this scenario, v(0) and v(1) may both be fixed to zero such that only the paths going through region 520 may be traversed. Thus, only a quarter of the eight signal points, or signal points 0 and 4, may be used in the signaling scheme. Similarly, only one of the cosets, coset 0, may be selected for use in signaling. In fact, in this illustration, a coset selector may not be needed in a signal mapper (e.g., signal mapper 220 of FIG. 2), because only a single coset is available for use. An 8PAM signaling scheme that utilizes only the signal points in region 520 may be referred to as an 8PAM/4 scheme.

Note that, by limiting the signal points used to transmit or store information, the Euclidean distance between any two signal points in the scheme is maximized. The original 8PAM scheme may have signal points separated by one unit (e.g., one unit between signal point 0 and 1), which may be a unit of any type (e.g., voltage) and scale. By limiting the signal points to those within region 510, the resulting signal points used in the scheme are signal points 0, 2, 4, and 6. Thus, each pair of signal points is separated by at least two units.

Limiting the signal points to those within region 520 can increase the Euclidean distance between the signal points further. In particular, the resulting signal points in the 8PAM/4 scheme are points 0 and 4, which are separated by four units. Having an increased number of units between signal points can be advantageous, especially in transmission or storage systems that introduce a large amount of noise (e.g., systems with a low signal-to-noise (SNR)), as a large amount of noise may cause a decoder (e.g., TCM/BCM decoder 120 of FIG. 1) to mistake a received signal for an incorrect signal point.

Figure 6:
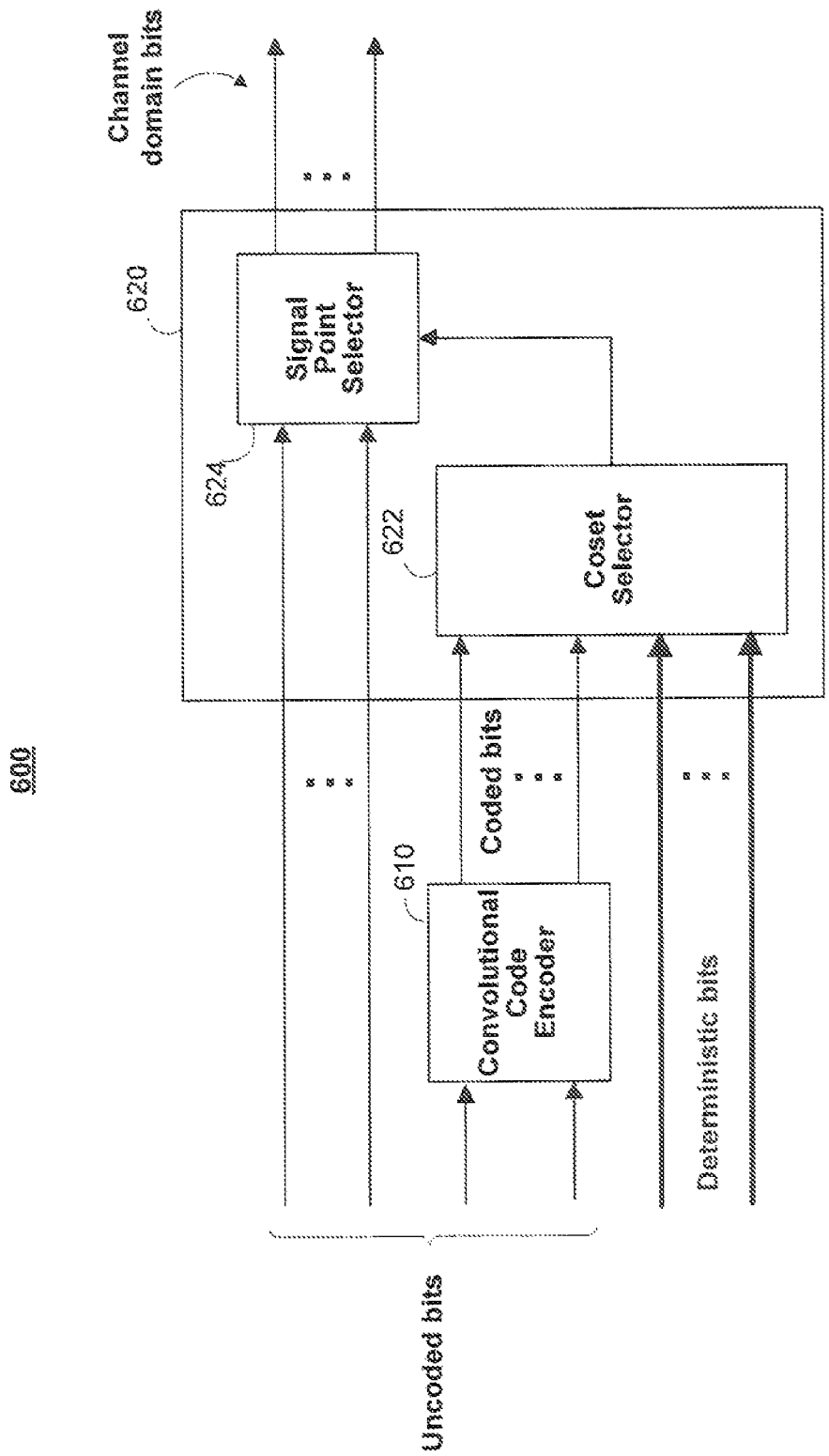
FIGS. 6-8 show simplified block diagrams of fractional TCM encoders.

Referring now to FIG. 6, a simplified block diagram of TCM encoder 600 is shown that can employ fractional encoding in accordance with an embodiment of the present invention. As with TCM encoders 200 and 300 of FIGS. 2 and 3, TCM encoder 600 can include convolutional code encoder 610 and signal mapper 620, where signal mapper 620 can include coset selector 622 and signal point selector 624. These components of encoder 600 may have any of the features and functionalities described above in connection with corresponding components in encoders 200 and 300. For example, coset selector 622 and signal point selector 624 can have any of the features and functionalities of coset selector 222 and signal point selector 224 of TCM encoder 200.

In FIG. 6, the inputs to coset selector 622 may include not only the coded bits from convolutional code encoder 610, but also one or more deterministic bits. In one implementation, the deterministic bits are coupled to the least significant bits of the inputs of coset selector 622. In one implementation, the deterministic bits are hard-coded or hard-wired into coset selector 622, and do not vary depending on the value of any of the non-deterministic inputs into signal mapper 620 (e.g., the coded bits (to coset selector 622) or the uncoded bit inputs (to signal point selector 624)). Coset selector 622 may select a particular coset based on the values of the deterministic bits and the coded bits. As the deterministic bits are each fixed to one value and cannot take on the other value, coset selector 622 is limited to selecting from only a subset of the available cosets for a given modulation scheme. For example, if an 8PAM scheme is used with a set partitioning format shown in FIGS. 4 and 5, having one deterministic bit fixed to zero in essence fixes v(0) to zero, and limits coset selector 622 to selecting between coset 0 and coset 1. Similarly, having two deterministic bits set to zero in essence fixes v(0) and v(1) to zero, and limits coset selector 622 to selecting coset 0. Thus, the deterministic bits of FIG. 6 allow TCM encoder 600 to implement fractional encoding.

Figure 7:
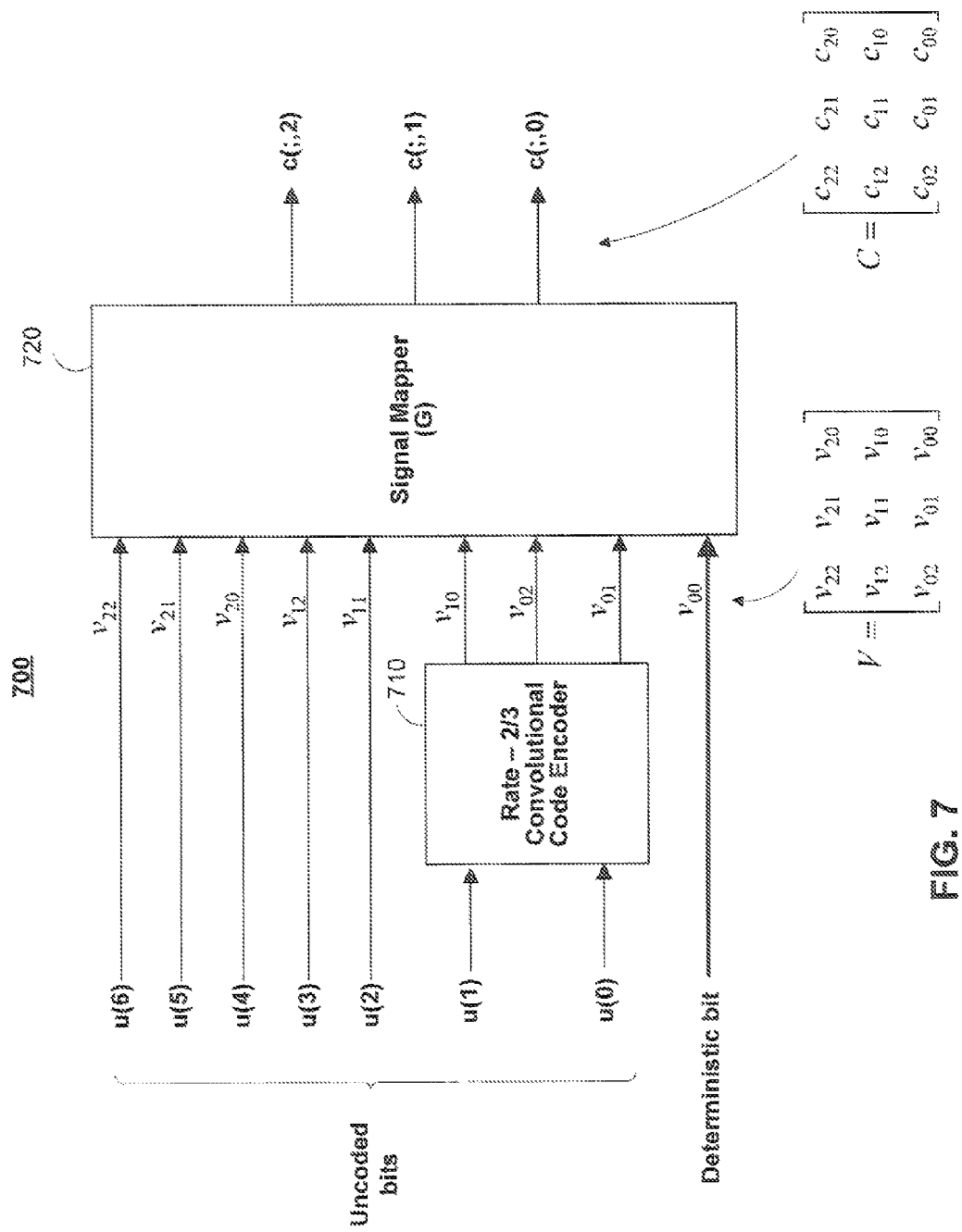
Figure 8:
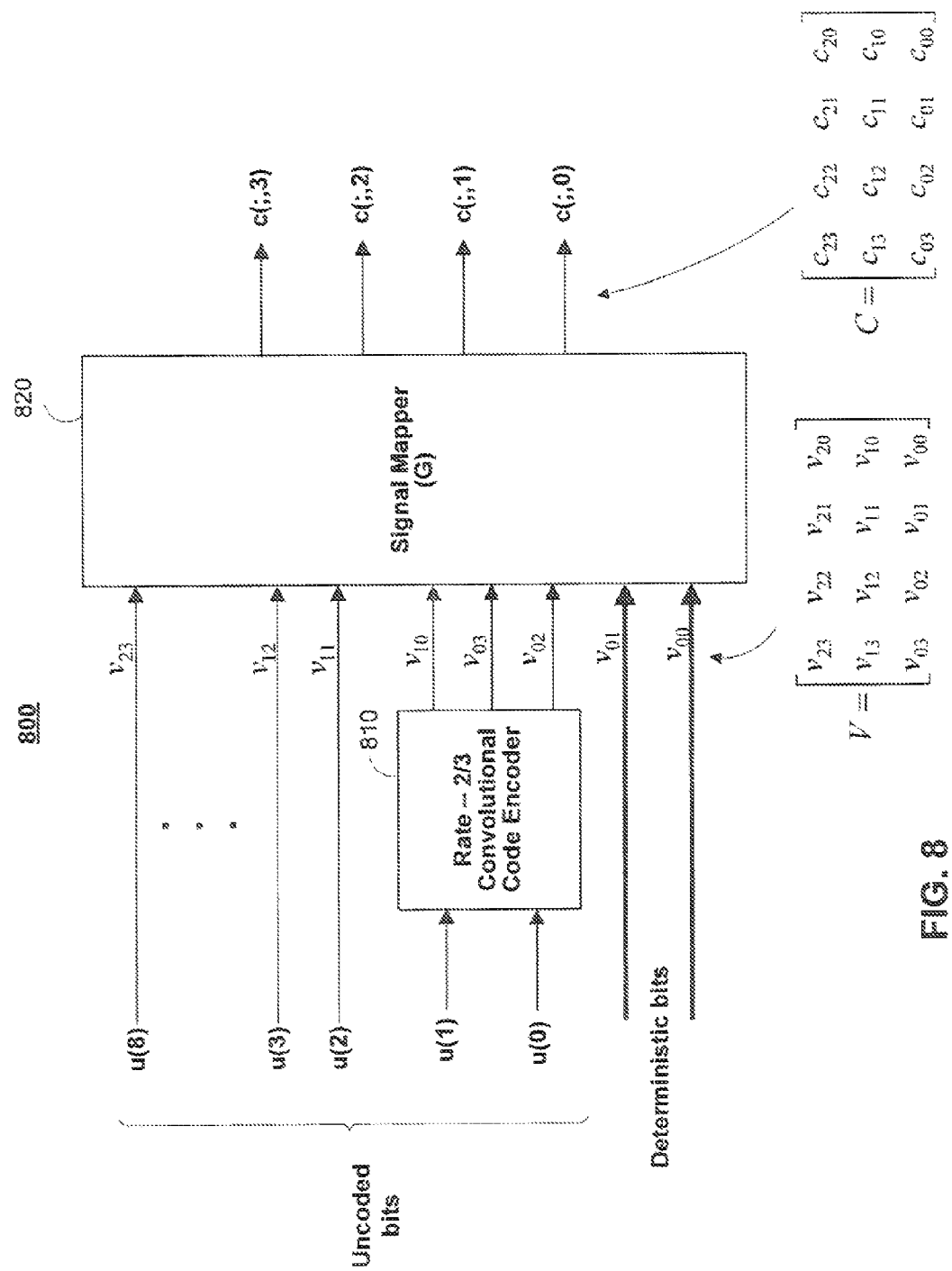

FIGS. 7 and 8 show additional illustrative encoders that can employ fractional decoding by including at least one deterministic bit. These encoders may be particular embodiments of the general fractional encoder shown in FIG. 6. The encoders of FIGS. 7 and 8 can additionally employ multi-dimensional trellis-coded or block-coded modulation. That is, as a result of the encoding performed by the encoders of FIGS. 7 and 8, a multi-dimensional modulation scheme, such as (8PAM)$^2$ or (8PAM)$^4$, can be used to modulate the encoded information.

Referring first to FIG. 7, a simplified block diagram of TCM encoder 700 is shown that can employ set partitioning and fractional encoding for a three-dimensional, (8PAM)$^3$ modulation scheme. TCM encoder 700 can convert seven user information bits, u(0) through u(6), into three output vectors in the channel domain that can be transmitted or stored using the (8PAM)$^3$ modulation scheme. TCM encoder 700 may include rate-$\frac{2}{3}$ convolutional code encoder 710 that encodes the least significant two bits of the user domain information, u(0) and u(1), into three coded bits, v_01, v_02, and v_10. Thus, as illustrated in FIG. 7, eight coded domain bits may be provided to signal mapper 720, along with a deterministic bit, v_00, that can be fixed to zero or one. The inputs to signal mapper 720 may be represented in matrix form as a 3×3 matrix bits, V. This matrix is illustrated in FIG. 7.

Because of the deterministic bit, v_00, signal mapper 720 can select between half of the available cosets for the modulation scheme employed by TCM encoder 700. For example, because signal mapper 720 has four inputs used to select a coset, signal mapper 720 can select between 2^4=16 cosets. As only three of the four input bits can vary, signal mapper 720 can utilize at most 2^3=8 cosets, or half of the 16 available cosets. Signal mapper 720 can then use its remaining five inputs, v_11, v_12, v_20, v_21, and v_22 to select a particular signal point vector that is to be transmitted or stored.

In addition to the set partitioning process described above, signal mapper 720 can map the coded domain bits in matrix V to a set of bits in a channel domain. The mapped bits may be represented by another 3×3 matrix referred to by the symbol C, whose components are illustrated in FIG. 7. Signal mapper 720 may produce matrix C from matrix V using a matrix, G, sometimes referred to as a coset generator matrix. In one embodiment, the coset generator matrix for signal mapper 720 may be given by $$G = \begin{bmatrix} 1 & 1 & 1 \\ 0 & 1 & 1 \\ 0 & 0 & 1 \end{bmatrix}, \tag{EQ. 1}$$

and can map the coded domain bits of V to the channel domain bits of C based on the equation, $$C = VG. \tag{EQ. 2}$$

Thus, as illustrated by the 3×3 matrix C, signal mapper 720 may map the coded domain bits into a set of nine channel domain bits. The nine bits can be decomposed into three vectors of three bits each and transmitted or stored as three 8PAM signals, or one (8PAM)$^3$ signal. The C matrix representation of the channel domain bits illustrates a technique for converting the channel domain bits to signals. In particular, each column of matrix C may represent one three-bit vector that can be converted into an 8PAM dimension of the (8PAM)$^3$ signal. For example, if $$C = \begin{bmatrix} 0 & 0 & 1 \\ 1 & 0 & 1 \\ 0 & 1 & 0 \end{bmatrix},$$

the leftmost column vector, "010," may be transmitted in the third dimension of the (8PAM)$^3$ signal (dimension 2), while the rightmost column vector, "110," may be transmitted in the first dimension of the (8PAM)$^3$ signal (dimension 0).

Signal mapper 720 of TCM encoder 700 can be configured to convert bits from a coded domain to a channel domain based on EQ. 2 shown above. This operation can be reversed by applying the inverse of the coset generator matrix to a C matrix. In particular, matrix V can be recovered according to the equation, $$V = CG^{-1}.\qquad\text{(EQ. 3)}$$

This operation of recovering the coded domain information may sometimes be referred to as reverse mapping, which will be discussed in greater detail below in connection with decoding fractional signal vectors. The inverse of the coset generator matrix of EQ. 1 is given by, $$G^{-1} = \begin{bmatrix} 1 & 1 & 1 \\ 0 & 1 & 1 \\ 0 & 0 & 1 \end{bmatrix}\qquad\text{(EQ. 4)}$$

Therefore, EQS. 3 and 4 produce an equation for the deterministic bit given by $v\_00 = c\_20 + c\_01 + c\_00$. The bottom row of the C matrix is therefore limited to having an even parity if the deterministic bit is set to one, or is limited to an odd parity if the deterministic bit is set to zero. The parity limitation is, in essence, another way to interpret the reduction in the signal set produced by fractional encoding and decoding.

An $(8PAM)^3$ signaling scheme can represent at most nine user information bits if no redundancy is added to the user information bits. However, TCM encoder 700 is operable to transmit only seven user information bits, $u(0)$ through $u(6)$, in a single $(8PAM)^3$ signal vector. Thus, the code rate of the overall communications or storage system (e.g., system 100 of FIG. 1) may be ⅞. The code rate may refer to the fraction of the transmitted or stored information that contains actual information (as opposed to redundant or irrelevant information). Without fractional encoding, and maintaining a 2/3-rate convolutional code encoder for encoder 710, TCM encoder 700 would be operable to produce an $(8PAM)^3$ signal vector from eight user information bits, resulting in a code rate of ⅚. Thus, by increasing or decreasing the number of deterministic bits, the code rate of the system can advantageously be adjusted to a desired code rate.

FIG. 8 shows a simplified block diagram of TCM encoder 800 in accordance with another embodiment of the present invention. TCM encoder 800 can produce an $(8PAM)^4$ signal vector based on nine user information bits, $u(0)$ through $u(8)$. TCM encoder 800 may therefore have a code rate of 9/12=¾, which can advantageously be increased or decreased by changing the number of deterministic bits. To produce the additional three bits in the coded domain (for a total of 12 coded domain bits), TCM encoder 800 can include two deterministic bits and a two-input three-output rate-⅔ convolutional code encoder 810. Signal mapper 820 may therefore have twelve input bits, where five of the inputs (e.g., the LSBs) can be used to select a particular coset. The twelve input bits in the coded domain may be represented by a 3×4 matrix, V, which is illustrated in FIG. 8.

Signal mapper 820 can convert the bits of V into 12 channel domain bits according to a 4×4 coset generator matrix. The coset generator matrix may be given by, for example, $$G = \begin{bmatrix} 1 & 1 & 1 & 1 \\ 0 & 1 & 0 & 1 \\ 0 & 0 & 1 & 1 \\ 0 & 0 & 0 & 1 \end{bmatrix}.\qquad\text{(EQ. 5)}$$

Signal mapper 820 can obtain the C matrix by multiplying the matrix V of coded domain bits by the coset generator matrix of EQ. 5. The resulting matrix of channel domain bits can be converted to an $(8PAM)^4$ signal, where each column of matrix C may be converted to a separate 8PAM dimension of the multi-dimensional $(8PAM)^4$ signal.

A TCM decoder in accordance with an embodiment of the present invention can receive one or more signals from a TCM encoder, such as those described above in connection with FIGS. 2, 3 and 6-8, and can attempt to reconstruct the user information contained within the one or more signals or signal vectors. To reconstruct the user information, the TCM decoder may first identify which coset the user information bits belong in, and can then identify the likely value of the user information from within the identified coset. The TCM decoder can operate based on any of the principles or embodiments discussed in the Burd application.

Figure 9:
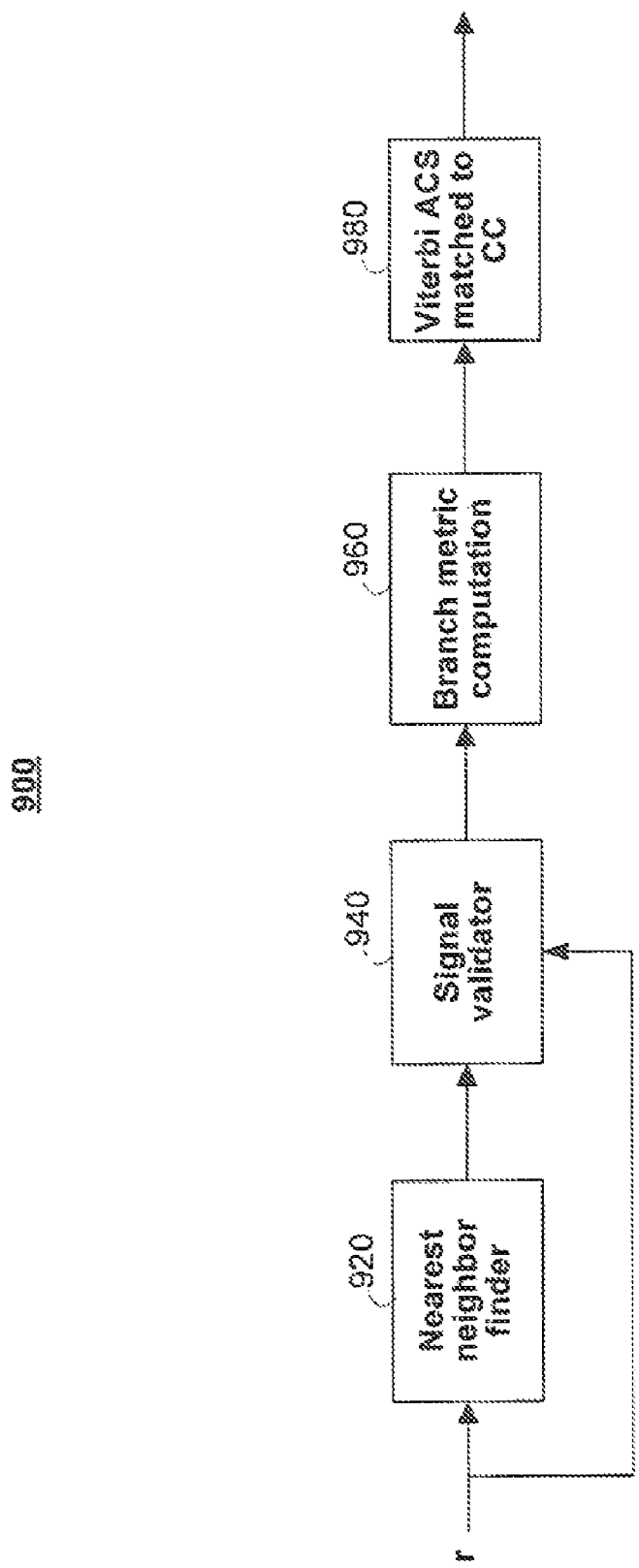
FIG. 9 shows a simplified block diagram of a fractional TCM decoder.

FIG. 9 shows a simplified block diagram of TCM decoder 900 for decoding a signal that is fractionally encoded and modulated based on set partitioning. TCM decoder 900 can be a more detailed representation of TCM/BCM decoder 120 of FIG. 1. TCM decoder 900 can include nearest neighbor finder 920, signal validator 940, branch metric computation unit 960, and Viterbi add-compare-select (ACS) unit 980. Nearest neighbor finder 920, branch metric computation unit 960, and Viterbi ACS unit 980 may have any of the features and functionalities, and may operate according to any of the principles of, any corresponding components in the decoders described in the Burd application (e.g., the decoders of FIGS. 7 and 15).

Nearest neighbor finder 920, for example, can identify the signal points in each dimension that are closest in Euclidean distance to the value of the received signal vector, r, in that dimension. For instance, if r is an $(8PAM)^4$ signal, nearest neighbor finder 920 can identify two or four signal points in each of the four dimensions, where the two or four signal points in a particular dimension are the signal points closest to the value of r in that same dimension. A set of test vectors can be created based on the neighbors identified by nearest neighbor finder 920, where each test vector includes one of the nearest neighbors in each dimension. The set of all possible test vectors may sometimes be referred to as a test set, T(r). The notation of T(r) makes clear that the values in test set T(r) depend on the value of the particular received signal vector, r, which in turn determines the nearest neighbors in each dimension.

Because TCM decoder 900 is a fractional decoder, only a fraction of all of the test vectors in T(r) may be valid signal vectors in the fractional signaling scheme. Therefore, TCM decoder 900 can include signal validator 940 for determining whether each of the test vectors in test set T(r) correspond to a valid signal vector. For example, if TCM decoder 900 operates using a multi-dimensional signaling scheme based on 8PAM, but operates using only those signal points shown in region 510 of FIG. 5, signal validator 940 may determine that a signal vector with signal point 2 is valid. On the other hand, signal validator 940 may determine that a signal vector with signal point 3 is invalid. Signal validator 940 can provide the valid test vectors to branch metric computation unit 960, and can discard the invalid test vectors. Thus, signal validator 940 ensures that TCM decoder 900 only operates using the test vectors that are valid in the current signaling scheme.

Branch metric computation unit 960 may compute branch metrics based on the valid test vectors received from signal validator 940, and can assign the computed branch metrics to branches of a trellis diagram. The trellis diagram may be matched to the convolutional code used by the corresponding TCM encoder (e.g., convolutional code encoder 610 of FIG. 6). Branch metric computation unit 960 may compute branch metrics using any suitable technique, such as any of the equations provided in the Burd application. Using the branch metrics, Viterbi ACS unit 980 can traverse the trellis diagram matched to the convolutional code to select a most likely path through the trellis diagram. As each branch taken by Viterbi ACS unit 980 can correspond to a particular coset, Viterbi ACS unit 980 may be able to identify the cosets associated with the transmitted or stored user information. From the coset information, TCM decoder 900 can determine the actual information that was transmitted or stored.

TCM decoder 900 of FIG. 9 is merely illustrative. In some embodiments, the functionalities of the illustrated components may be combined or modified, or additional components may be added to TCM decoder 900, without departing from the scope of the present invention. For example, signal validator 904 may be implemented as part of branch metric computation unit 960 rather than as a separate component.

Figure 10:
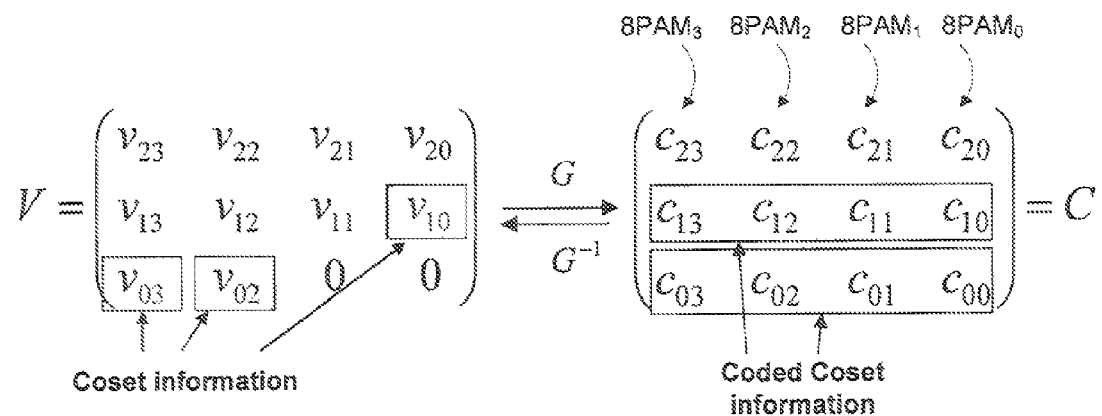
FIG. 10 shows a matrix representation of signal mapping and reverse mapping between a coded domain and a channel domain.
Figure 11:
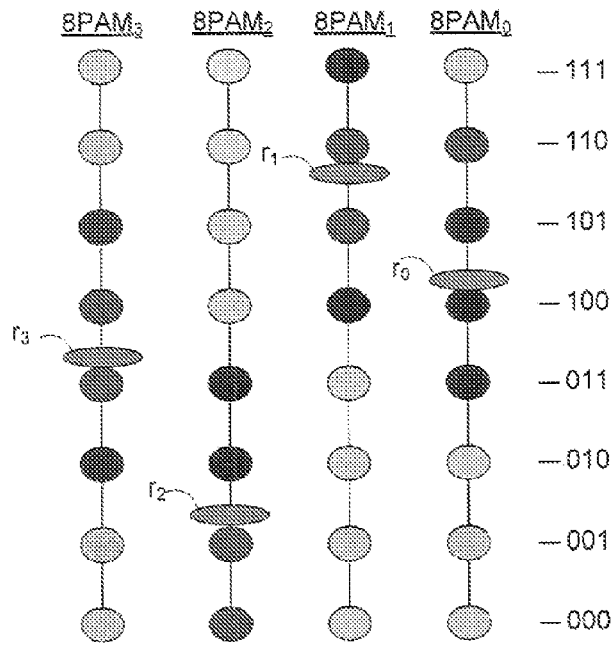
FIG. 11 shows a graphical representation of an illustrative received multi-dimensional signal vector and four nearest neighbors in each dimension.

The operation of nearest neighbor finder 920 and signal validator 940 of TCM decoder 900 will now be described using an example shown in FIGS. 10 and 11. These figures and corresponding descriptions are merely illustrative, as the principles of operation described in connection with these examples can apply to any other suitable data structure, modulation scheme, or fractional signaling scheme. FIG. 10 shows the structure of a particular V matrix and C matrix, and can be used to illustrate the number of nearest neighbors needed per dimension for proper operation of TCM decoder 900. FIG. 11 shows a graphical representation of a received signal vector, and illustrates the nearest neighbors that can be selected by nearest neighbor finder 920 in one embodiment of the present invention. The signal vectors illustrated in FIGS. 10 and 11 may be similar to the signal vectors produced by TCM encoder 800 of FIG. 8. Thus, in some embodiments, TCM decoder 900 may represent the decoder opposite to TCM encoder 800.

Referring first to FIG. 10, a 3×4 matrix V and a 3×4 matrix C are shown that can correspond to the matrices shown in FIG. 8. As described in connection to FIG. 8, the coset of matrix V may be defined by five bits—two deterministic bits that are fixed to zero, and three bits obtained from a convolutional code encoder. The three variable bits that define the coset, which may sometimes be referred to as coset information, are outlined in the V matrix of FIG. 10. Once the V matrix is mapped to the C matrix, the coset information is spread into the bottom two rows of the C matrix. In particular, the bottom row of V may be mapped based on the coset generator matrix into the bottom row of C, and the middle row of V may be mapped based on the coset generator matrix into the middle row of C. The bits of matrix C that include information regarding the coset may sometimes be referred to as coded coset information. A signal vector received by TCM decoder 900 may therefore have coded coset information contained within the least significant two bits (of three) in each dimension.

For proper operation of Viterbi ACS unit 980 of FIG. 9, branch metrics may need to be computed for each branch of the trellis diagram associated with Viterbi ACS unit 980. Thus, for the data structure of FIG. 10, at least one branch metric may be computed for each coset. To ensure that all of the branches are populated, nearest neighbor finder 920 can select four nearest neighbors in each dimension. The four nearest neighbors in a dimension provide all four combinations of the least significant two bits—the bits that include the coded coset information. Signal validator 940 and branch metric computation unit 960 may therefore be guaranteed to work with at least two test vectors in T(r) for each coset. A more detailed explanation of the number of nearest neighbors that should be selected is provided in the Burd application.

FIG. 11 shows an illustrative received signal vector that, in one operating scenario, can be received by TCM decoder 900 of FIG. 9. The signal values of the received signal vector in each dimension are shown as flattened ovals, and the signal points in the $(8PAM)^4$ modulation scheme are shown as circles. The received signal vector may take on the values of $(r\_3, r\_2, r\_1, r\_0)$. In this scenario, nearest neighbor finder 920 can select the four nearest neighbors in each dimension indicated by the 8PAM signal points that are darkened in FIG. 11. A test set, T(r), of $4^4=256$ test vectors can be formed from the illustrated nearest neighbors, and signal validator 940 may operate on these 256 test vectors to determine which test vectors correspond to valid cosets.

Signal validator 940 can operate on each of the 256 test vectors. For each test vector, signal validator 940 can reverse map the least significant bits of the test vector. This corresponds to converting the bottom row of the C matrix in FIG. 10 to the bottom row of the V matrix. For a test vector to be valid, $v\_00$ and $v\_01$ should be equal to zero. Thus, if signal validator 940 determines that these bits are equal to zero, signal validator 940 can conclude that the test vector is valid and can provide the test vector to branch metric computation unit 960. Otherwise, signal validator 940 can discard that particular test vector.

In other embodiments, rather than performing a complete reverse map, signal validator 940 can perform any other suitable operations to determine whether a test vector is valid. For example, due to deterministic bits of the encoder, the least significant bit of each dimension (e.g., the bottom row of the C matrix of FIG. 10) may be constrained to having either even or odd parity. In this case, signal validator 940 can determine whether a test vector is valid by examining the parity of the least significant bits. In some embodiments, signal validator 940 can perform multiple validation functions. For example, signal validator 940 can use the parity constraint to determine whether the Euclidean distance for a test vector should be calculated, and can then perform a reverse mapping (if necessary) to determine which coset the test vector belongs in.

Of the 256 test vectors formed from the nearest neighbors shown in FIG. 11, signal validator 940 may invalidate and discard 192 of the test vectors. In particular, reverse mapping the LSBs of each test vector may produce an equal number of "00," "01," "10," and "11" values for $v\_00$ and $v\_01$. As only the test vectors that produce "00" for $v\_00$ and $v\_01$ qualify as valid, only a quarter, or 64, test vectors may remain after validation by signal validator 940. Then, as there may be eight branches in the trellis diagram of the convolutional code, for example, each branch of the trellis diagram can be associated with eight (or 64/8) valid test vectors. That is, the branch metric for each branch may be computed based eight valid test vectors that are associated with the same coset.

If signal validator 940 were to operate based on all the possible signal vectors rather than just the test vectors in T(r), signal validator 940 would attempt to validate $8^4=4096$ signal vectors. Of the 4096 signal vectors, branch metric computation unit 960 would obtain a quarter, or 1024, of the signal vectors, and may compute Euclidean distances for all 1024 signal vectors. Note that these numbers are considerably greater than those used by TCM decoder 900 of FIG. 9. Thus, TCM decoder 900, which can operate based on nearest neighbors and test set T(r), can be computationally inexpensive compared to a decoder that operates on all of the possible signal vectors.

Figure 12:
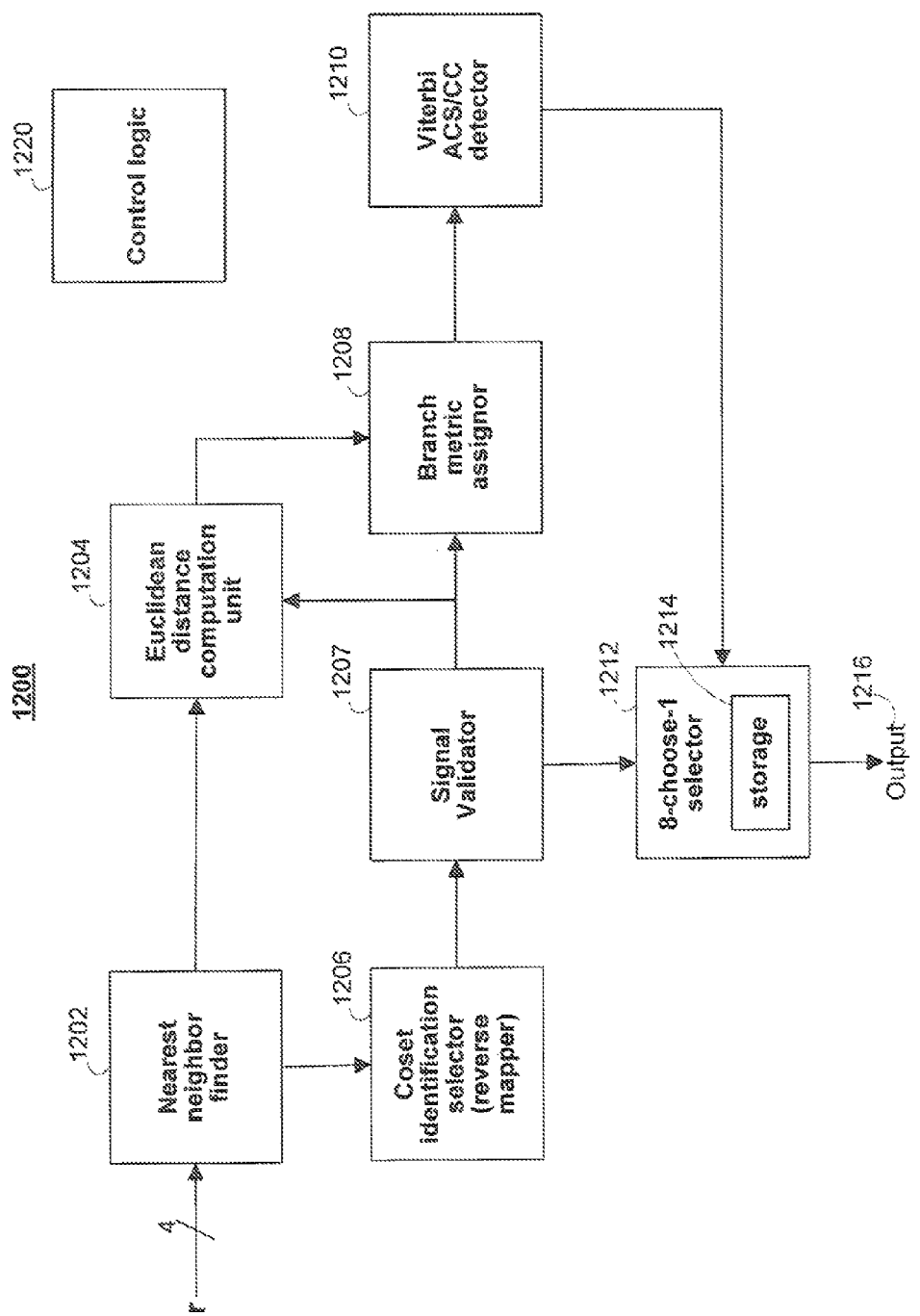
FIG. 12 shows a more detailed, yet still simplified, block diagram of the fractional TCM decoder of FIG. 9.

FIG. 12 shows a more detailed, yet still simplified, block diagram of a TCM decoder 1200 that can operate according to any of the principles described above for TCM decoder 900. TCM decoder 1200 of FIG. 12 can include many components that can have any of the features and functionalities, and operate based on any of the principles, of the decoder in FIG. 15 of the Burd application. Thus, the description of these components will remain brief with the understanding that the description of corresponding components in the Burd application can apply to these components.

The functionality of branch metric computation unit 960 of FIG. 9 may be embodied in, for example, Euclidean distance computation unit 1204 and branch metric assignor 1208. For example, the branch metrics computed by TCM decoder 1200 may be based on the Euclidean distances computed by Euclidean distance computation unit 1204 and assigned to a branch by branch metric assignor 1208. Thus, in some embodiments, TCM decoder 1200 can compute branch metrics according to, $$BM(coseti) \approx \min_{y \in i-th\, coset} \left\{ \sum_{j=0}^{4} (r_j - s_j)^2 \right\}, \quad (\text{EQ. 6})$$

for each coset i. That is, Euclidean distance computation unit 1204 may compute a Euclidean distance-based metric, $$\sum_{j=0}^{4} (r_j - s_j)^2,$$

between a received signal vector, r, and each valid test vector in T(r), s, where j indexes to a particular dimension of the multi-dimensional signal vectors. Branch metric assignor 1208 may then assign the minimum Euclidean distance metric for the coset to the branch associated with that coset.

In addition to having the components shown and described in the Burd application, TCM decoder 1200 can include signal validator 1207. Signal validator 1207 can be the same or similar to signal validator 940 of FIG. 9, and can be used to limit the computations performed by Euclidean distance computation unit 1204 and branch metric assignor 1208 to test vectors and cosets that are valid in the current fractional signaling scheme.

In some embodiments, TCM decoder 1200 can include additional control logic 1220 that can further reduce the computational complexity of computing and assigning branch metrics. Control logic 1220 may be any hardware, software, or firmware-based logic that can be coupled to or can affect the operation of at least some of the other components in TCM decoder 1200. For the 3×4 example of FIGS. 10 and 11, the functionality of control logic 1220 can allow TCM decoder 1200 to reduce the number of test vectors in T(r). Nearest neighbor finder 1202 can form T(r) based on two nearest neighbors to produce a total of 2^4=16 test vectors. Signal validator 1207 may then determine that only a quarter, or four, of the test vectors are valid signal vectors in the fractional signaling scheme. For a four-state trellis diagram with eight branches, four test vectors are not sufficient to populate every branch with a branch metric. Thus, four of the branches may be assigned branch metrics by branch metric assignor 1208 according to the techniques discussed above. For the remaining branches, control logic 1220 can select the remaining test vectors based on the four valid test vectors.

Referring back to FIG. 10, the structure of the example V matrix and C matrix can illustrate the technique used by control logic 1220 to obtain the remaining test vectors necessary to have a full set of branch metrics. This example is merely illustrative, as the principles of operation described in connection with this example can apply to any other suitable data structure, modulation scheme, or fractional signaling scheme.

Because two nearest neighbors are selected per dimension, the test set does not have a complete set of values for the $v\_10$ bit of the coded coset information. This is because $v\_10$ is not in the LSB position of the 8PAM signal. As described above, when the coset generator matrix has properties similar to the generator matrix of EQ. 1, the final coded coset information bit, $v\_10$, may be subject to the constraint, $$v\_10 = c\_13 + c\_12 + c\_11 + c\_10. \quad (\text{EQ. 7})$$

Figure 14:
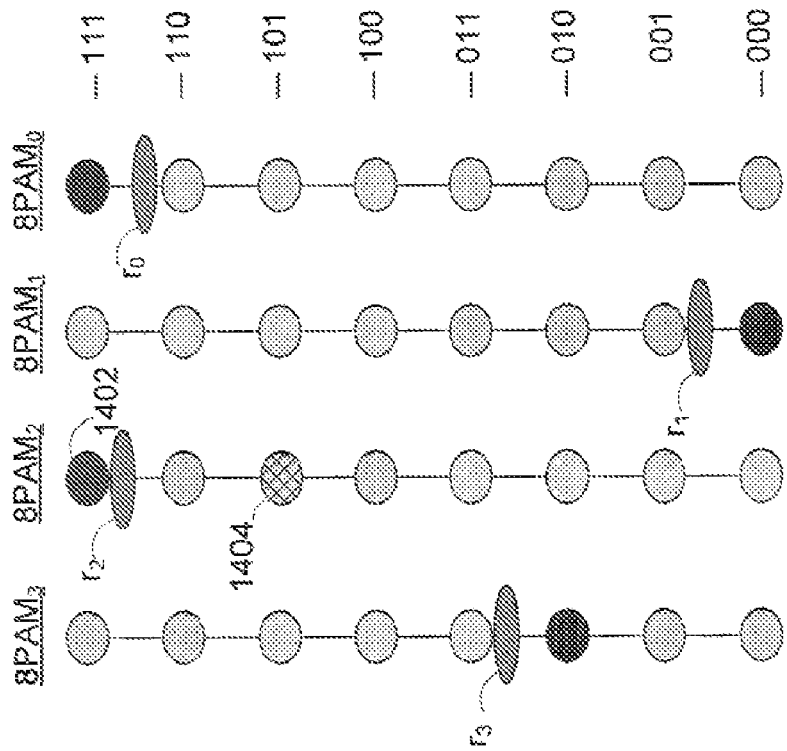
FIGS. 13 and 14 show graphical representations of an illustrative received multi-dimensional signal vector and two nearest neighbors in each dimension.

EQ. 7 suggests that $v\_10$ can be flipped if any bit in the middle row of matrix C is flipped. Therefore, control logic 1220 can convert each of the four valid test vectors in T(r) to a test vector in a remaining coset by changing a signal point in only one 8PAM dimension of the original valid test vector. Examples of this process are shown in FIGS. 13 and 14.

Figure 13:
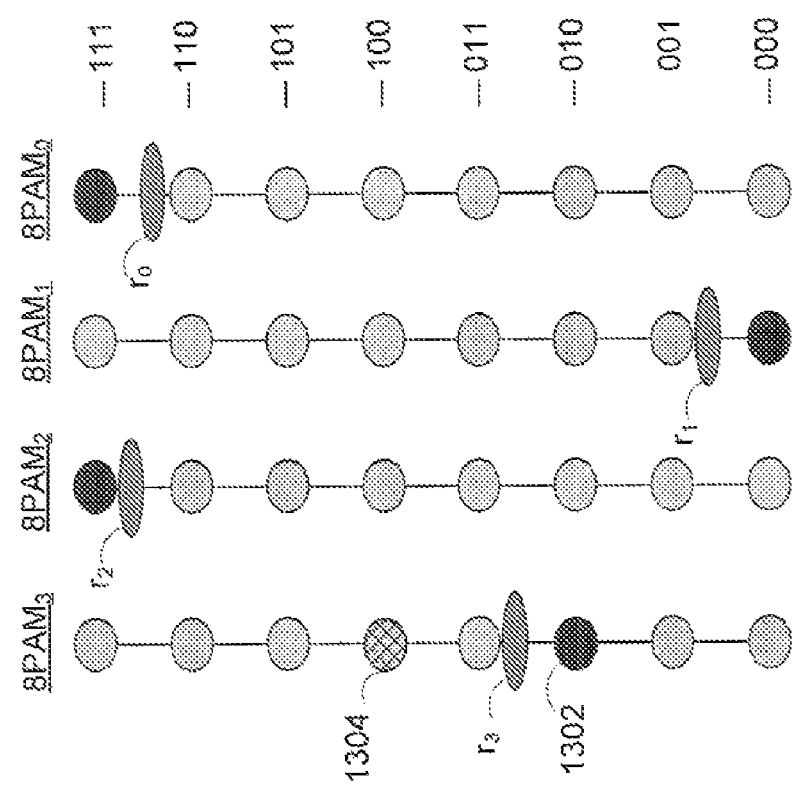

FIG. 13 shows an illustrative (8PAM)$^4$ signal vector, $r=(r\_1, r\_2, r\_3, r\_4)$. The darkened circles may represent the signal points that form a valid test vector. In this scenario, the corresponding C matrix for this valid test vector may be given by, $$C = \begin{bmatrix} 0 & 1 & 0 & 1 \\ 1 & 1 & 0 & 1 \\ 0 & 1 & 0 & 1 \end{bmatrix},$$

and its reverse mapped and valid V matrix may be given by, $$V = \begin{bmatrix} 0 & 1 & 0 & 0 \\ 1 & 0 & 1 & 1 \\ 0 & 1 & 0 & 0 \end{bmatrix}.$$

Thus, looking at the $v\_10$, $v\_03$, and $v\_02$ positions of this V matrix, matrix C can be used to compute branch metrics for the branch associated with the "101" coset. Control logic 1220 may obtain another valid test vector by switching the test point in the fourth dimension (or 8PAM_3 dimension) of the (8PAM)$^3$ signal. For example, control logic 1220 may alter the valid test vector by replacing test point 1302 with test point 1304. Control logic 1220 may select test point 1304, because test point 1304 is a signal point that has a different bit value at its second bit position (zero instead of one), test point 1304 is the closest signal point to $r\_3$ with this different bit value, and test point 1304 has the same bit value at its LSB (zero). For simplicity, the original signal point in the valid test vector (e.g., test point 1302) may sometimes be referred to as the "first nearest neighbor" for that dimension, and the alternative test point selected by control logic 1220 (e.g., test point 1304) may sometimes be referred to as the "second nearest neighbor" for that dimension.

In accordance with EQ. 7, because of the bit flip in the fourth dimension in the second row of matrix C (position $c\_13$), the final bit of the coset information (position $v\_10$) may be flipped from one to zero. Thus, as the bottom row of matrix C remains unchanged, the remaining bits of the coset information are unchanged. The new test vector produced by control logic 1220 may therefore correspond to the coset, "001," which may be associated with a branch in the trellis diagram that has not yet been assigned a branch metric. In some scenarios, the test vector that includes test point 1304 may be used by Euclidean distance computation unit 1204 and branch metric assignor 1208 to assign a branch metric to a previously unassigned branch.

Instead of switching the test point in the fourth dimension to obtain a new test vector, control logic 1220 may switch the test point in any one of the other three dimensions. For example, FIG. 14 shows the same signal vector, r=(r_1, r_2, r_3, r_4) and valid test vector, but illustrates an alternate test vector obtained by switching the test point in the third dimension (or the 8PAM_2 dimension) of the (8PAM)$^4$ signal set. In this operating scenario, control logic 1220 may obtain a new test vector by replacing test point 1402, the first nearest neighbor for the third dimension, with signal point 1404, the second nearest neighbor. Note that, as with signal point 1304 of FIG. 13, test point 1404 has a different bit value at its second bit, but the same bit value at its LSB. Therefore, the new test vector illustrated by FIG. 14 may also produce a valid test vector for the "001" coset—that is, the same coset as FIG. 13.

In some embodiments, TCM decoder 1200 can compute branch metrics for a particular coset based on one or more of the alternative test vectors produced by altering a valid test vector in T(r). TCM decoder 1200 can compute a Euclidean distance metric for each of the alternate test vector associated with the particular coset, and can set the branch metric to the smallest of the computed Euclidean distances. Thus, using FIGS. 13 and 14 again as examples, TCM decoder 1200 can compute the branch metric for coset "001" by determining whether altering the first, second, third, or fourth dimension of the valid test vector produces the test vector with the smallest Euclidean distance. Control logic 1220 may produce the four altered test vectors, where two of these are shown in FIGS. 13 and 14. Euclidean distance computation unit 1204 can compute the Euclidean distances associated with each of these test vectors, and branch metric assignor 1208 may assign the smallest Euclidean distance as the branch metric for the appropriate branch. Illustrative steps taken by TCM decoder 1200 to compute and assign branch metrics are described below in connection with FIGS. 16 and 17.

For a test vector produced by altering another test vector, Euclidean distance computation unit 1204 can compute a Euclidean distance using the Euclidean distance previously computed for the other test vector. For example, referring again to the test vector illustrated by FIG. 13, the Euclidean distance associated with the test vector with test point 1304 can be computed using the Euclidean distance associated with the test vector with test point 1302. Euclidean distance computation unit 1204 may, for example, add a delta difference to the previously computed Euclidean distance. The delta difference can be the difference between the distance between r_3 and test point 1304 and the distance between r_3 and test point 1302. The delta difference can be more readily appreciated from FIG. 15, which shows a larger view of the fourth dimension of the (8PAM)$^4$ signal set.

Figure 15:
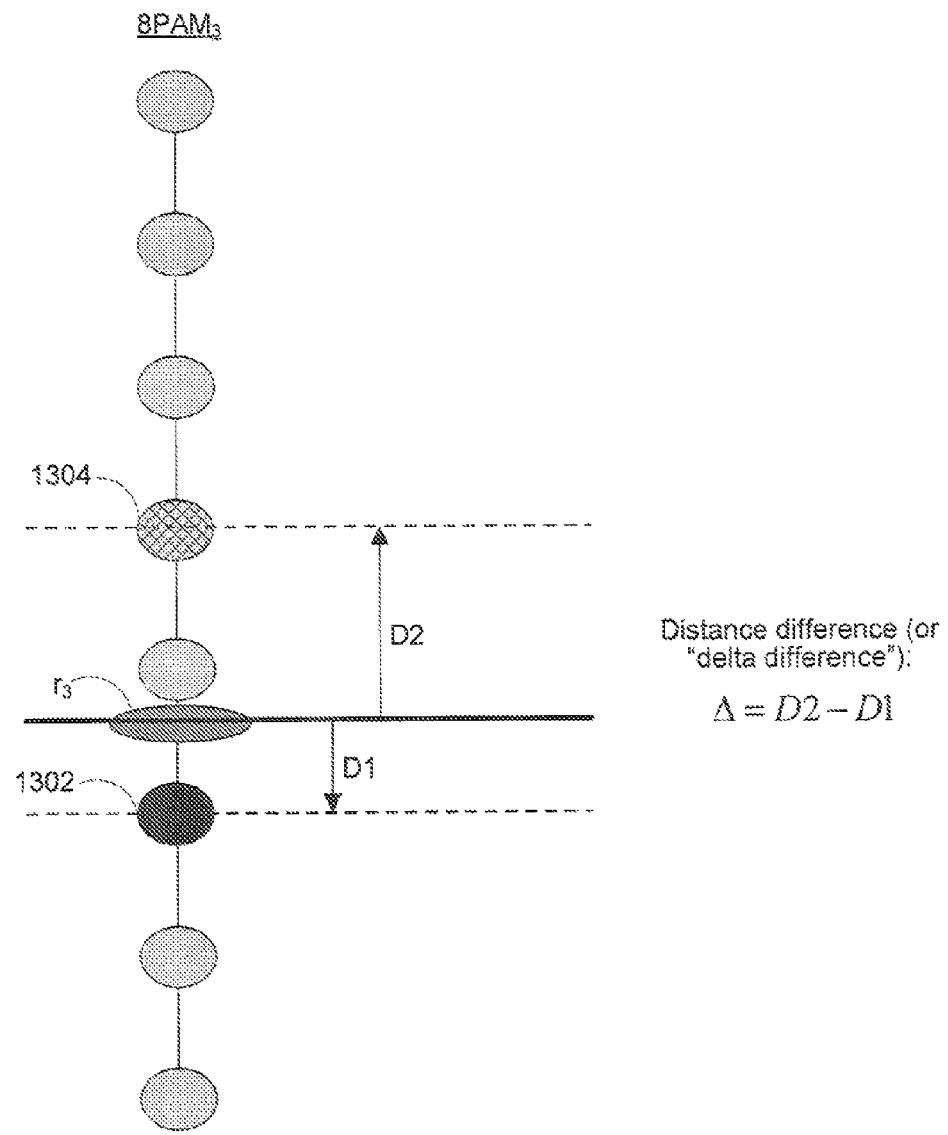
FIG. 15 shows a larger view of one dimension of the illustrative received multi-dimensional signal vector in FIGS. 13 and 14.

In FIG. 15, the Euclidean distance between signal point 1304 and r_3 may be represented by D2, while the Euclidean distance between signal point 1302 and r_3 may be represented by D1. The delta difference is then given by D2−D1. Thus, Euclidean distance computation unit 1204 can obtain the Euclidean distance of the test vector with test point 1304 by adding the delta difference to the Euclidean distance for the original valid test vector. This can be computationally less expensive and can be a faster computation than computing the full Euclidean distance, as the value of only one dimension of the signal vector is needed to perform the computation.

Figure 16:
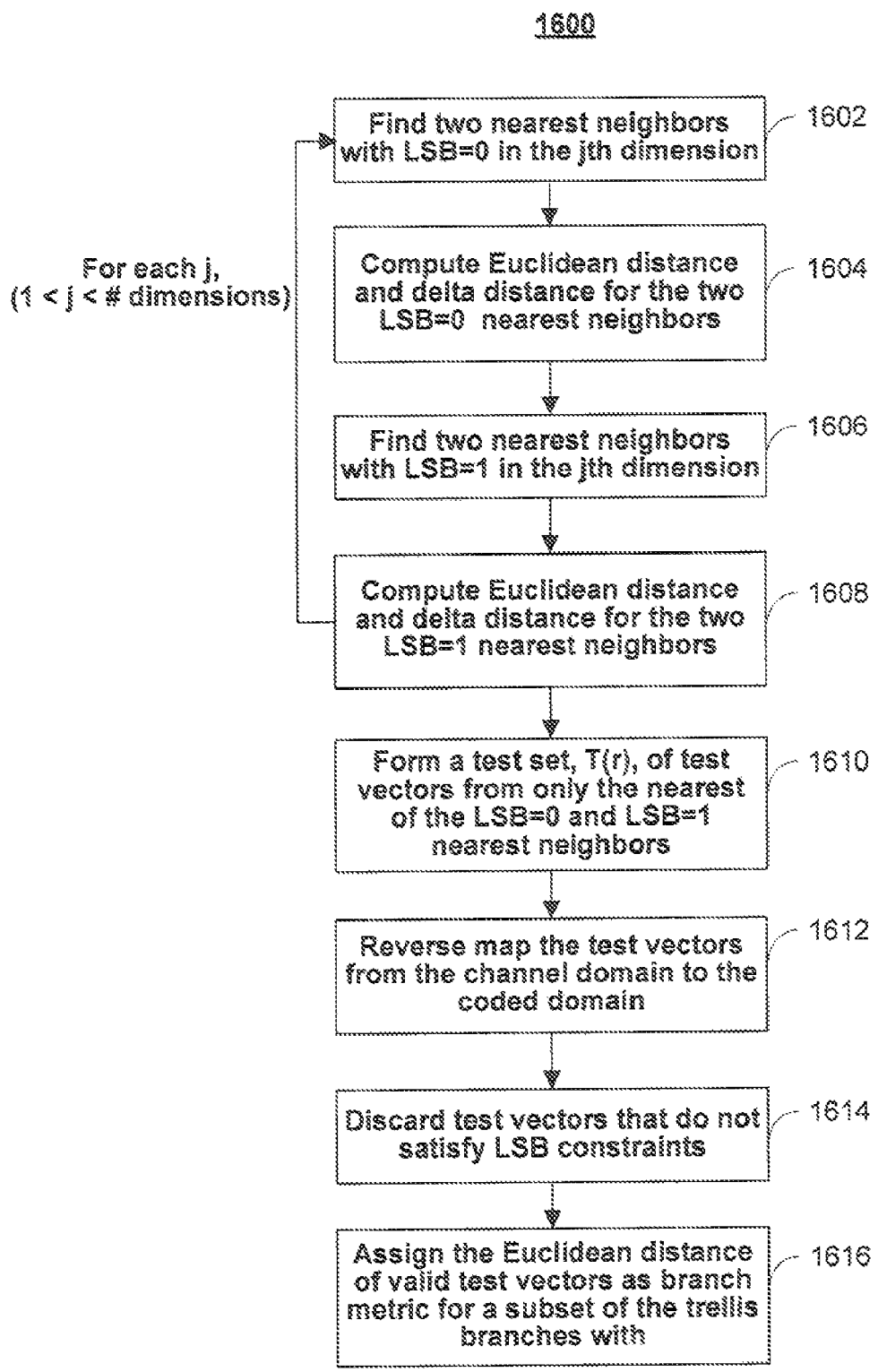
FIGS. 16 and 17 show illustrative flow diagrams for decoding a received multi-dimensional signal vector based on a fractional TCM signal constellation set.
Figure 17:
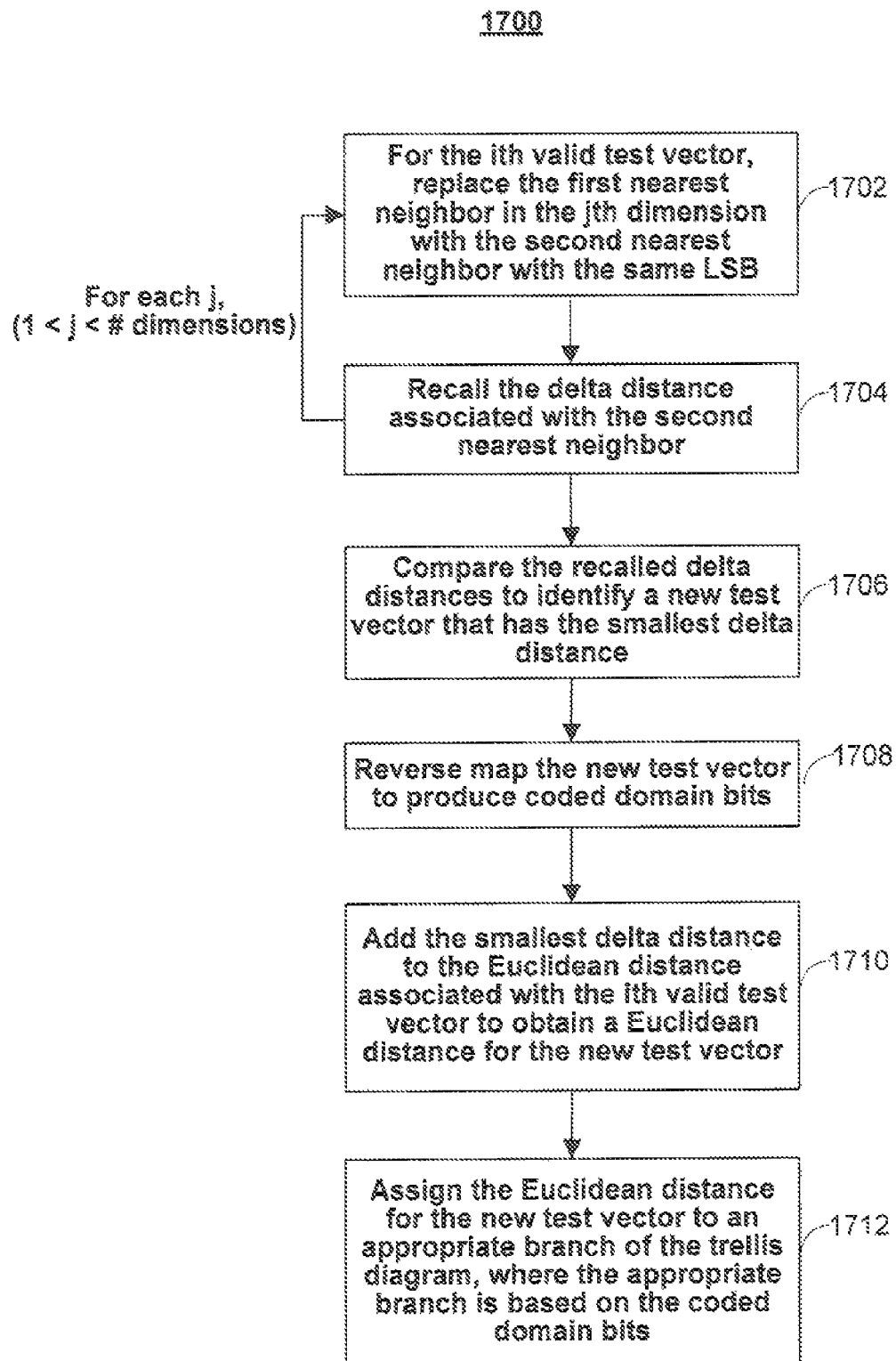

FIGS. 16 and 17 show flow diagrams of illustrative processes for computing branch metrics for all of the branches of a trellis diagram. FIGS. 16 and 17 illustrate the steps that can be taken by a decoder (e.g., TCM decoder 900 of FIG. 9 or TCM decoder 1200 of FIG. 12) to compute branch metrics for a communications or storage system with a data structure similar to that shown by FIG. 10. For example, the steps may represent the operation of a decoder operable to decode an (8PAM)$^4$ signal received from TCM encoder 800 of FIG. 8. The principles of operation illustrated by these flow diagrams can be applied to systems of different data structures, modulation schemes, and fractional signaling schemes.

Referring first to FIG. 16, a flow diagram of process 1600 is shown that illustrates the steps involved for initializing branch metric computations and for computing branch metrics based on first nearest neighbors. At step 1602, the decoder can find two nearest neighbors with a zero-valued LSB—a first nearest neighbor and a second nearest neighbor—for a first dimension of a multi-dimensional received signal vector. The decoder can then compute, at step 1604, a first Euclidean distance from the first nearest neighbor to the received signal vector at the first dimension and a second Euclidean distance from the second nearest neighbor to the received signal vector at that distance. Also at step 1604, the decoder may compute the delta distance for these nearest neighbors. Then, at step 1606, the decoder can find two nearest neighbors having one-valued LSBs in the first dimension (a first and a second nearest neighbor), and at step 1608, the decoder may compute the Euclidean distance from each of the new nearest neighbors to the received signal and the delta distance for these one-valued nearest neighbors.

Process 1600 can then return to step 1602, where the decoder can find nearest neighbors for the second dimension of the received signal vectors. The decoder may execute steps 1602, 1604, 1606, and 1608 until the decoder has found nearest neighbors and computed Euclidean and delta distances for each of the dimensions in the multi-dimensional received signal vector. For example, for an (8PAM)$^4$ signal vector, the decoder may compute these steps each four times. Once the decoder has completed the necessary number of iterations of these steps, process 1600 can continue to step 1610.

At step 1610, the decoder may form a test set, T(r). The test set can include a plurality of test vectors that are formed using only the first zero-valued nearest neighbor and the first one-valued nearest neighbors in each dimension. Thus, overall, the test set can be formed with the two signal points in each dimension that are the closest to the received signal vector at that dimension. Continuing to step 1612, the decoder may reverse map the test vectors from the channel domain to the coded domain. In the coded domain, the decoder can evaluate the coset information and the bits that are deterministic. Thus, at step 1614, the decoder can use the coded domain bits to discard test vectors that do not satisfy the constraints of the signaling scheme. For example, the decoder can discard the test vectors that do not have LSBs equal to the value of the deterministic bits. Then, at step 1618, the decoder can assign branch metrics to a subset of the trellis branches for a Viterbi ACS (e.g., Viterbi ACS 1210 of FIG. 12). These Euclidean distances may be based on the Euclidean distances computed previously for the first nearest neighbors at steps 1604 and 1608.

Because two nearest neighbors may not be sufficient to assign a branch metric to all the branches in the trellis diagram, the decoder can compute additional steps to obtain branch metrics for the remaining branches. The decoder can obtain these branch metrics using the second nearest neighbors found at steps 1602 and 1604, which were not used to form the test set at step 1610. The illustrative steps that the decoder can perform for each valid test vector are shown in process 1700 of FIG. 17. Thus, in some embodiments, a decoder can perform the steps of process 1700 one or more times after performing the steps of process 1600.

At step 1702 of process 1700, for a given valid test vector, the decoder can replace the signal point at the first dimension with a second nearest neighbor having the same-valued LSB. The second nearest neighbor may be either a nearest neighbor found at step 1602 or at step 1604, depending on whether the LSB of the given valid test vector for the first dimension is equal to zero or one. Thus, once the decoder completes step 1702, the Euclidean distance associated with the newly formed test vector, referred to as an alternate test vector for simplicity, is greater than the Euclidean distance associated with the given valid test vector by a delta distance. At step 1704, the decoder can recall the delta distance associated with the second nearest neighbor used at step 1702.

Process 1700 can then return to step 1702, where the decoder can perform steps 1702 and 1704 for each of the other dimensions in the modulation scheme. For example, if an $(8PAM)^4$ modulation scheme is used, the decoder can perform steps 1702 and 1704 a total of four times, and may recall four different delta distances at step 1704. Once the decoder has performed these steps for each dimension, process 1700 can move on to step 1706. At step 1706, the decoder can determine which of the recalled delta distances is smallest. This allows the decoder to identify one of the alternate test vectors for use in decoding the received signal. The alternative test vector, for example, can be composed of the second nearest neighbor for the dimension associated with the smallest delta distance and the remaining signal points from the original test vector.

At step 1708, the decoder can reverse map the newly formed test vector from the channel domain to the coded domain to produce coded domain bits. Then, at step 1710, the decoder can add the smallest delta distance to the Euclidean distance associated with the original, given valid test vector. In this way, the decoder can obtain the Euclidean distance for the newly formed test vector. At step 1712, the decoder can assign the Euclidean distance that was computed at step 1710 to an appropriate branch of the trellis diagram. The appropriate branch may be based on the coded domain bits obtained from reverse mapping the new test vector, and in particular, may be based on coset information contained within the coded domain bits. Process 1700 can then move back to step 1702, where the decoder can compute another test vector based on another valid test vector in T(r) (e.g., the T(r) formed at step 1610 in FIG. 16). These steps may be repeated for each of the valid test vectors in T(r) such that the decoder can assign branch metrics to each branch of the trellis diagram.

Process 1600 of FIG. 16 and process 1700 of FIG. 17 are merely illustrative. Any steps in these processes may be modified (e.g., performed in a different order), combined, or removed, and any additional steps may be added to these processes, without departing from the scope of the present invention.

Referring now to FIGS. 18-24, various exemplary implementations of the present invention are shown.

Figure 18:
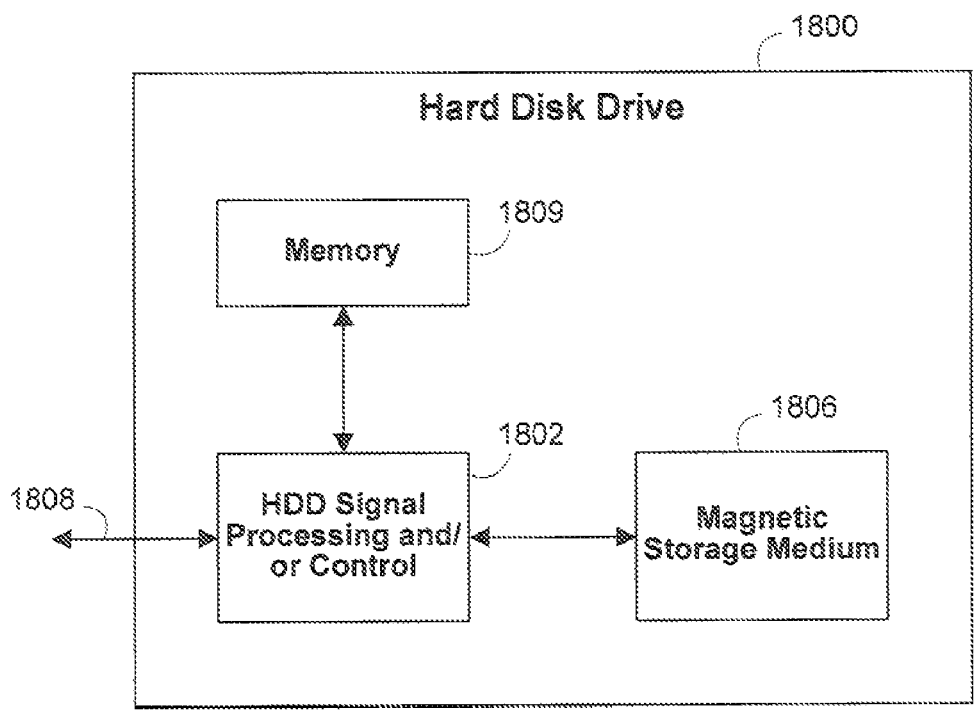
FIG. 18 is a block diagram of an exemplary hard disk drive that can employ the disclosed technology.

Referring now to FIG. 18, the present invention can be implemented in a hard disk drive (HDD) 1800. The present invention may implement either or both signal processing and/or control circuits, which are generally identified in FIG. 18 at 1802. In some implementations, the signal processing and/or control circuit 1802 and/or other circuits (not shown) in the HDD 1800 may process data, perform coding and/or encryption, perform calculations, and/or format data that is output to and/or received from a magnetic storage medium 1806.

The HDD 1800 may communicate with a host device (not shown) such as a computer, mobile computing devices such as personal digital assistants, cellular phones, media or MP3 players and the like, and/or other devices via one or more wired or wireless communication links 1808. The HDD 1800 may be connected to memory 1809 such as random access memory (RAM), nonvolatile memory such as flash memory, read only memory (ROM) and/or other suitable electronic data storage.

Figure 19:
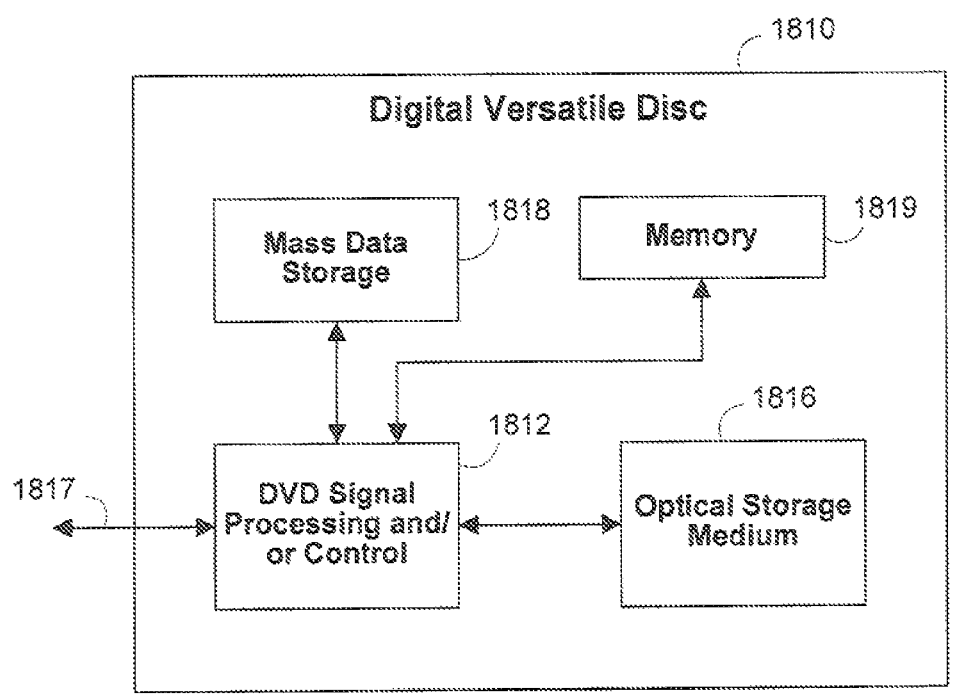
FIG. 19 is a block diagram of an exemplary digital versatile disc drive that can employ the disclosed technology.

Referring now to FIG. 19, the present invention can be implemented in a digital versatile disc (DVD) drive 1810. The present invention may implement either or both signal processing and/or control circuits, which are generally identified in FIG. 19 at 1812, and/or mass data storage 1818 of the DVD drive 1810. The signal processing and/or control circuit 1812 and/or other circuits (not shown) in the DVD drive 1810 may process data, perform coding and/or encryption, perform calculations, and/or format data that is read from and/or data written to an optical storage medium 1816. In some implementations, the signal processing and/or control circuit 1812 and/or other circuits (not shown) in the DVD drive 1810 can also perform other functions such as encoding and/or decoding and/or any other signal processing functions associated with a DVD drive.

The DVD drive 1810 may communicate with an output device (not shown) such as a computer, television or other device via one or more wired or wireless communication links 1817. The DVD drive 1810 may communicate with mass data storage 1818 that stores data in a nonvolatile manner. The mass data storage 1818 may include a hard disk drive (HDD). The HDD may have the configuration shown in FIG. 18. The HDD may be a mini HDD that includes one or more platters having a diameter that is smaller than approximately 1.8". The DVD drive 1810 may be connected to memory 1819 such as RAM, ROM, nonvolatile memory such as flash memory and/or other suitable electronic data storage.

Figure 20:
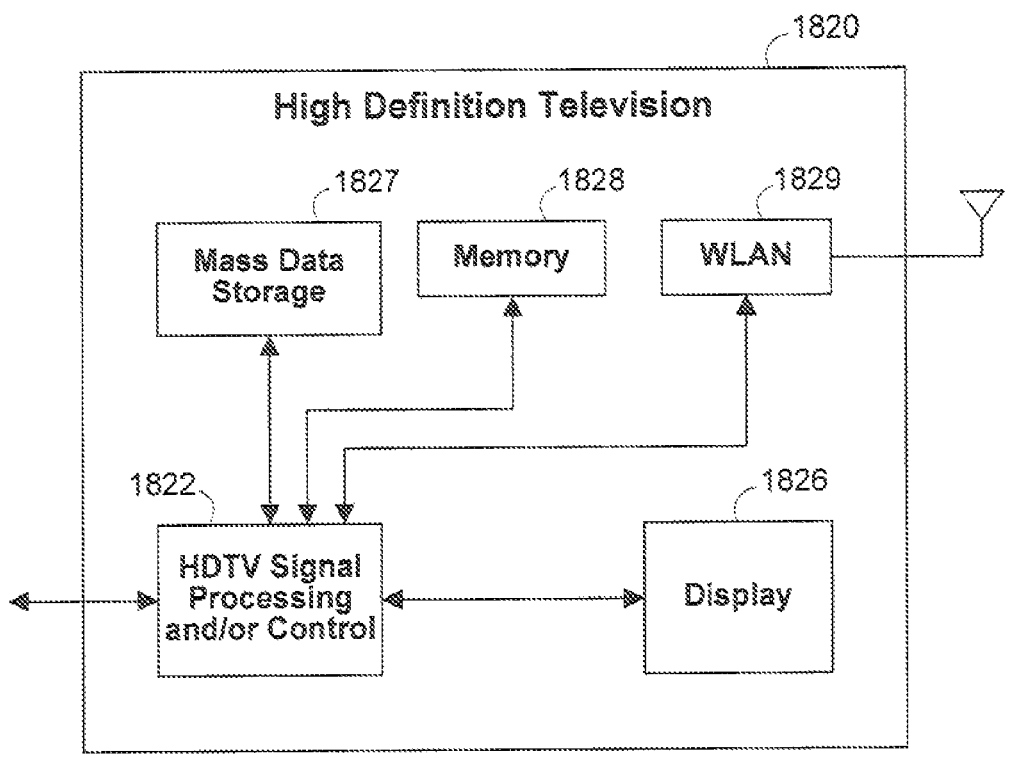
FIG. 20 is a block diagram of an exemplary high definition television that can employ the disclosed technology.

Referring now to FIG. 20, the present invention can be implemented in a high definition television (HDTV) 1820. The present invention may implement either or both signal processing and/or control circuits, which are generally identified in FIG. 20 at 1822, a WLAN network interface 1829 and/or mass data storage 1827 of the HDTV 1820. The HDTV 1820 receives HDTV input signals in either a wired or wireless format and generates HDTV output signals for a display 1826. In some implementations, signal processing circuit and/or control circuit 1822 and/or other circuits (not shown) of the HDTV 1820 may process data, perform coding and/or encryption, perform calculations, format data and/or perform any other type of HDTV processing that may be required.

The HDTV 1820 may communicate with mass data storage 1827 that stores data in a nonvolatile manner such as optical and/or magnetic storage devices for example hard disk drives and/or DVD drives. At least one HDD may have the configuration shown in FIG. 18 and/or at least one DVD drive may have the configuration shown in FIG. 19. The HDD may be a mini HDD that includes one or more platters having a diameter that is smaller than approximately 1.8". The HDTV 1820 may be connected to memory 1828 such as RAM, ROM, nonvolatile memory such as flash memory and/or other suitable electronic data storage. The HDTV 1820 also may support connections with a WLAN via WLAN network interface 1829.

Figure 21:
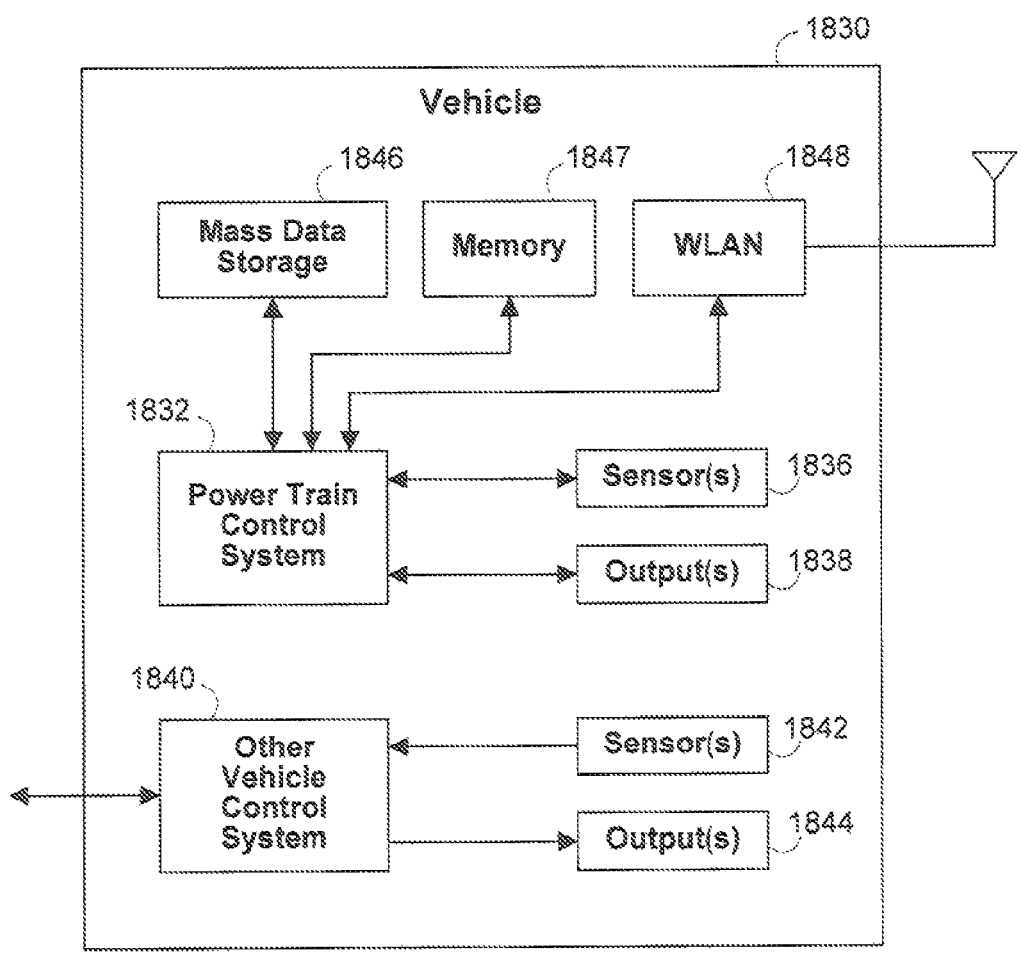
FIG. 21 is a block diagram of an exemplary vehicle that can employ the disclosed technology.

Referring now to FIG. 21, the present invention can be implemented in a control system of a vehicle 1830, a WLAN network interface 1848 and/or mass data storage 1846 of the vehicle 1830. In some implementations, the present invention can be implemented in a powertrain control system 1832 that receives inputs from one or more sensors such as temperature sensors, pressure sensors, rotational sensors, airflow sensors and/or any other suitable sensors and/or that generates one or more output control signals such as engine operating parameters, transmission operating parameters, braking parameters, and/or other control signals.

The present invention may also be implemented in another vehicle control system 1840 of the vehicle 1830. The vehicle control system 1840 may likewise receive signals from input sensors 1842 and/or output control signals to one or more output devices 1844. In some implementations, the vehicle control system 1840 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

The powertrain control system 1832 may communicate with mass data storage 1846 that stores data in a nonvolatile manner. The mass data storage 1846 may include optical and/or magnetic storage devices for example hard disk drives and/or DVD drives. At least one HDD may have the configuration shown in FIG. 18 and/or at least one DVD drive may have the configuration shown in FIG. 19. The HDD may be a mini HDD that includes one or more platters having a diameter that is smaller than approximately 1.8". The powertrain control system 1832 may be connected to memory 1847 such as RAM, ROM, nonvolatile memory such as flash memory and/or other suitable electronic data storage. The powertrain control system 1832 also may support connections with a WLAN via WLAN network interface 1848. The control system 1840 may also include mass data storage, memory and/or a WLAN network interface (all not shown).

Figure 22:
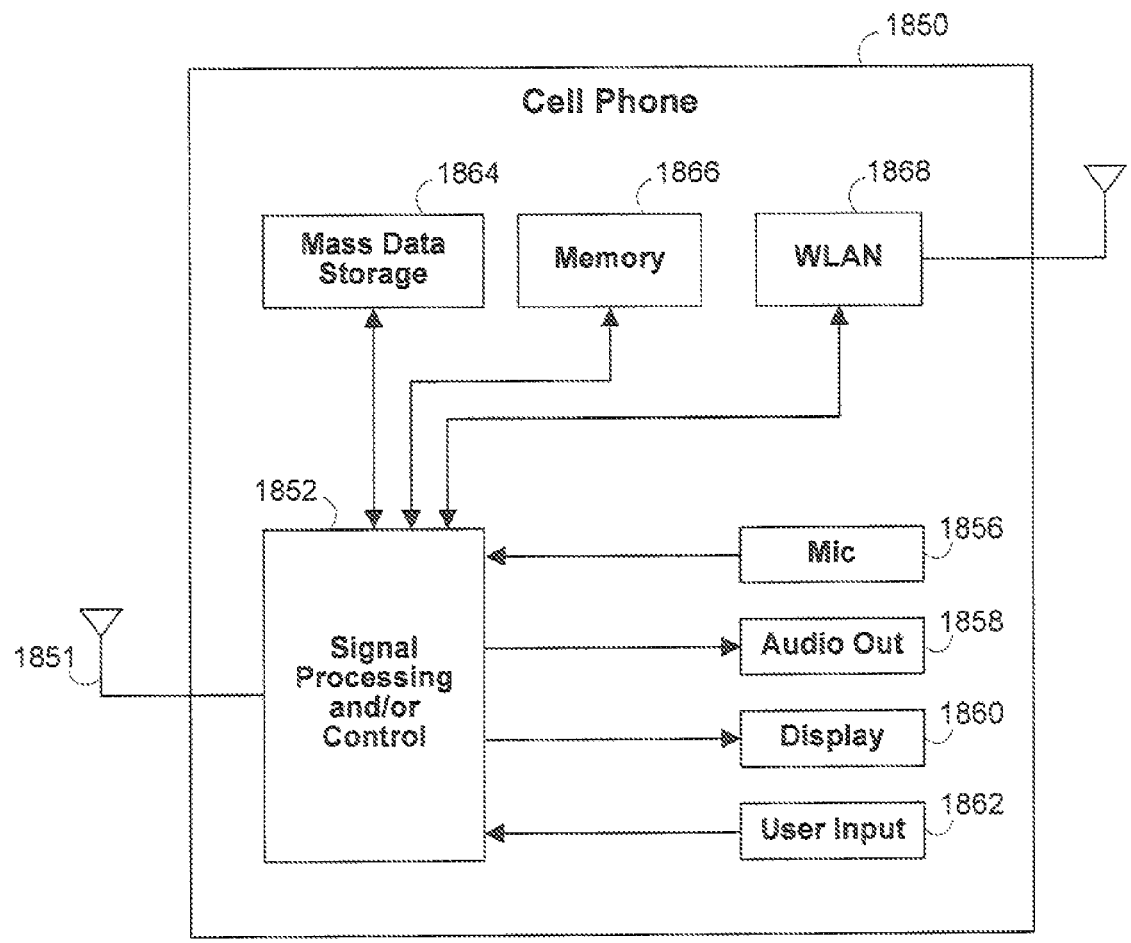
FIG. 22 is a block diagram of an exemplary cellular phone that can employ the disclosed technology.

Referring now to FIG. 22, the present invention can be implemented in a cellular phone 1850 that may include a cellular antenna 1851. The present invention may implement either or both signal processing and/or control circuits, which are generally identified in FIG. 22 at 1852, a WLAN network interface 1868 and/or mass data storage 1864 of the cellular phone 1850. In some implementations, the cellular phone 1850 includes a microphone 1856, an audio output 1858 such as a speaker and/or audio output jack, a display 1860 and/or an input device 1862 such as a keypad, pointing device, voice actuation and/or other input device. The signal processing and/or control circuits 1852 and/or other circuits (not shown) in the cellular phone 1850 may process data, perform coding and/or encryption, perform calculations, format data and/or perform other cellular phone functions.

The cellular phone 1850 may communicate with mass data storage 1864 that stores data in a nonvolatile manner such as optical and/or magnetic storage devices for example hard disk drives and/or DVD drives. At least one HDD may have the configuration shown in FIG. 18 and/or at least one DVD drive may have the configuration shown in FIG. 19. The HDD may be a mini HDD that includes one or more platters having a diameter that is smaller than approximately 1.8". The cellular phone 1850 may be connected to memory 1866 such as RAM, ROM, nonvolatile memory such as flash memory and/or other suitable electronic data storage. The cellular phone 1850 also may support connections with a WLAN via WLAN network interface 1868.

Figure 23:
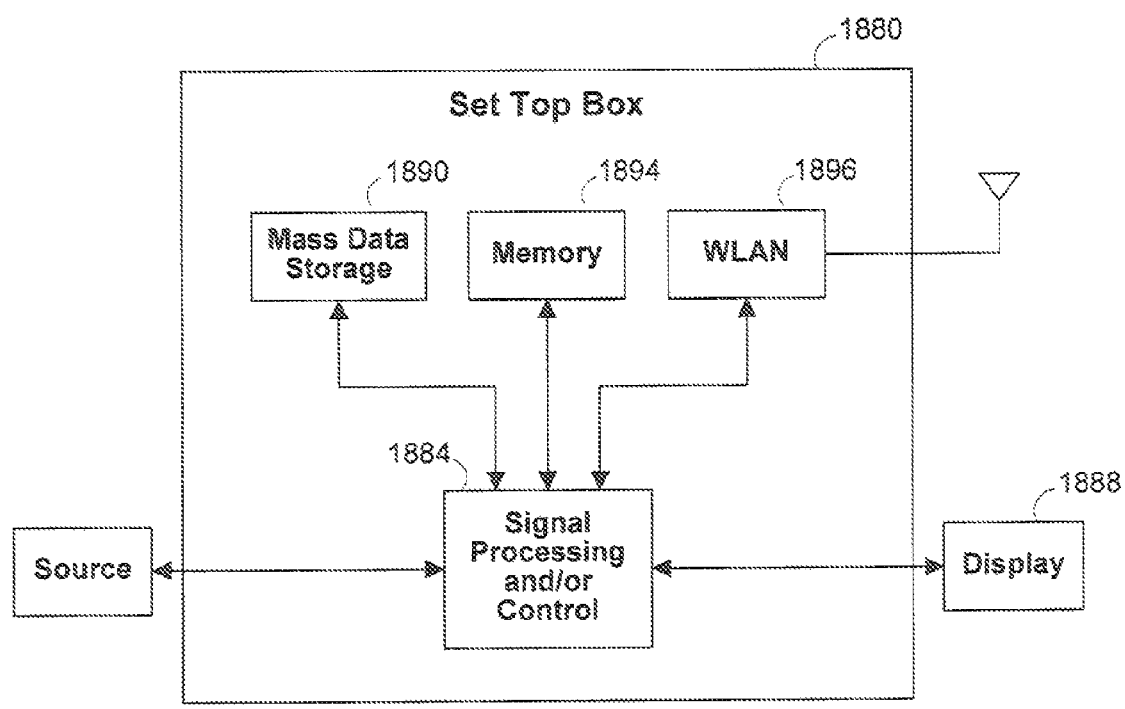
FIG. 23 is a block diagram of an exemplary set top box that can employ the disclosed technology.

Referring now to FIG. 23, the present invention can be implemented in a set top box 1880. The present invention may implement either or both signal processing and/or control circuits, which are generally identified in FIG. 23 at 1884, a WLAN network interface 1896 and/or mass data storage 1890 of the set top box 1880. The set top box 1880 receives signals from a source such as a broadband source and outputs standard and/or high definition audio/video signals suitable for a display 1888 such as a television and/or monitor and/or other video and/or audio output devices. The signal processing and/or control circuits 1884 and/or other circuits (not shown) of the set top box 1880 may process data, perform coding and/or encryption, perform calculations, format data and/or perform any other set top box function.

The set top box 1880 may communicate with mass data storage 1890 that stores data in a nonvolatile manner. The mass data storage 1890 may include optical and/or magnetic storage devices for example hard disk drives and/or DVD drives. At least one HDD may have the configuration shown in FIG. 18 and/or at least one DVD drive may have the configuration shown in FIG. 19. The HDD may be a mini HDD that includes one or more platters having a diameter that is smaller than approximately 1.8". The set top box 1880 may be connected to memory 1894 such as RAM, ROM, nonvolatile memory such as flash memory and/or other suitable electronic data storage. The set top box 1880 also may support connections with a WLAN via WLAN network interface 1896.

Figure 24:
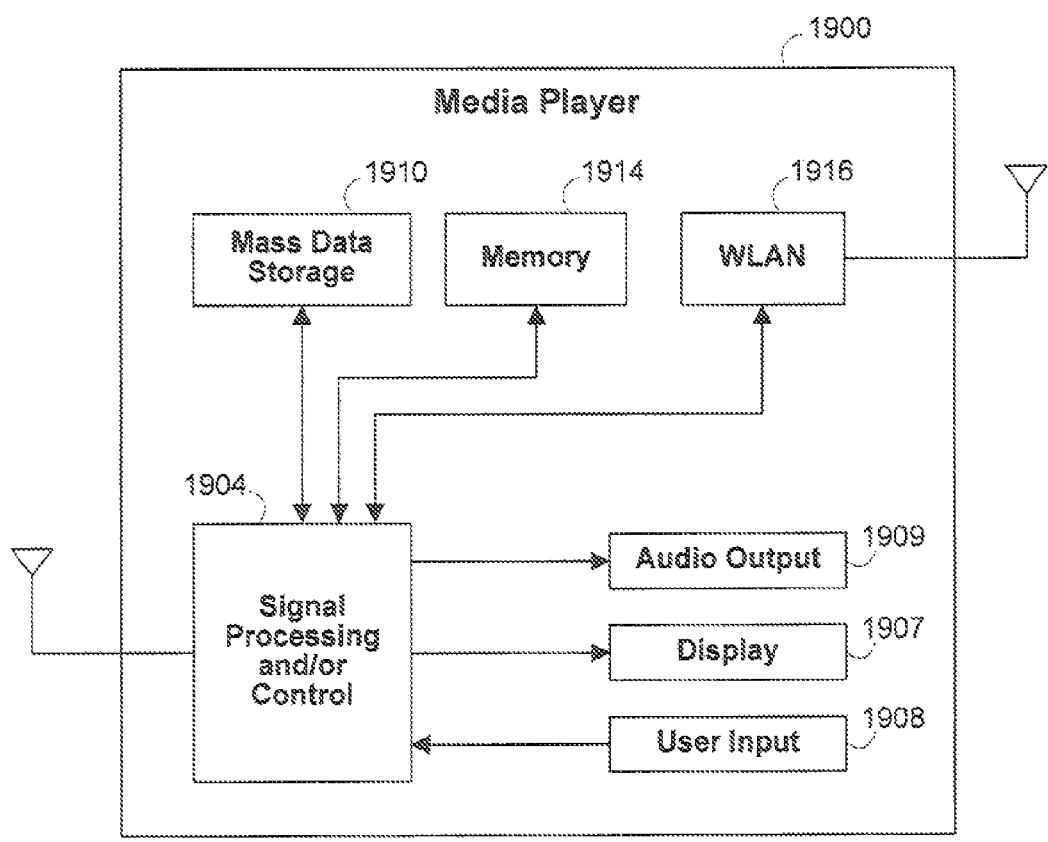
FIG. 24 is a block diagram of an exemplary media player that can employ the disclosed technology.

Referring now to FIG. 24, the present invention can be implemented in a media player 1900. The present invention may implement either or both signal processing and/or control circuits, which are generally identified in FIG. 24 at 1904, a WLAN network interface 1916 and/or mass data storage 1910 of the media player 1900. In some implementations, the media player 1900 includes a display 1907 and/or a user input 1908 such as a keypad, touchpad and the like. In some implementations, the media player 1900 may employ a graphical user interface (GUI) that typically employs menus, drop down menus, icons and/or a point-and-click interface via the display 1907 and/or user input 1908. The media player 1900 further includes an audio output 1909 such as a speaker and/or audio output jack. The signal processing and/or control circuits 1904 and/or other circuits (not shown) of the media player 1900 may process data, perform coding and/or encryption, perform calculations, format data and/or perform any other media player function.

The media player 1900 may communicate with mass data storage 1910 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices for example hard disk drives and/or DVD drives. At least one HDD may have the configuration shown in FIG. 18 and/or at least one DVD drive may have the configuration shown in FIG. 19. The HDD may be a mini HDD that includes one or more platters having a diameter that is smaller than approximately 1.8". The media player 1900 may be connected to memory 1914 such as RAM, ROM, nonvolatile memory such as flash memory and/or other suitable electronic data storage. The media player 1900 also may support connections with a WLAN via WLAN network interface 1916. Still other implementations in addition to those described above are contemplated.

The foregoing describes systems and methods for fractional encoding and fractional decoding in a multi-dimensional modulation scheme. Those skilled in the art will appre-

What is claimed is:

1. A fractional decoder for decoding a received signal vector modulated using a signaling scheme based on a multi-dimensional modulation scheme, wherein the signaling scheme uses at most half of available signal point vectors in the multi-dimensional modulation scheme, the fractional decoder comprising:
   a neighbor finder to identify at least two nearest neighbors in each dimension of the received signal vector;
   a signal validator to validate each of a plurality of potential signal vectors to produce a set of valid potential signal vectors, wherein the potential signal vectors are grouped into cosets and include signal points formed only from the at least two nearest neighbors in each dimension, and wherein the signal validator further determines whether each potential signal vector is a signal point vector that is part of the signaling scheme; and
   a detector to identify one of the cosets based on the valid potential signal vectors to produce an estimate of the received signal vector.

2. The fractional decoder of claim 1, wherein the at least two nearest neighbors are signal points in a particular dimension of the multi-level modulation scheme that are closest in Euclidean distance to that particular dimension of the received signal vector.

3. The fractional decoder of claim 1, wherein the signal validator comprises:
   a reverse mapper to map each potential signal vector from a channel domain to a coded domain, wherein the signal validator is configured to determine whether each of the mapped potential signal vectors in the coded domain satisfies a constraint.

4. The fractional decoder of claim 3, wherein the constraint is satisfied for one of the mapped potential signal vectors when that mapped potential signal vector includes a particular value for at least one bit.

5. The decoder of claim 1, wherein the signal validator is configured to determine whether a particular set of bits in each potential signal vector satisfies a constraint.

6. The fractional decoder of claim 1, wherein the detector comprises:
   a branch metric computation unit to compute branch metrics based on at least a subset of the set of valid potential signal vectors; and
   an add-compare-select unit to determine a path through a trellis diagram using the computed branch metrics, wherein each branch of the path corresponds to one of the cosets.

7. The fractional decoder of claim 6, wherein the branch metric computation unit is configured to:
   compute Euclidean distances between each valid potential signal vector and the received signal vector; and
   compute the branch metrics based on the Euclidean distances.

8. The fractional decoder of claim 6, wherein the add-compare-select unit is a Viterbi-based add-compare-select unit, and wherein the trellis diagram is matched to a convolutional code.

9. A method of decoding a received signal vector modulated using a signaling scheme based on a multi-dimensional modulation scheme, wherein the signaling scheme uses at most half of available signal point vectors in the multi-dimensional modulation scheme, the method comprising:
   identifying, using circuitry, at least two nearest neighbors in each dimension of the received signal vector;
   validating, using the circuitry, each of a plurality of potential signal vectors to produce a set of valid potential signal vectors, wherein the potential signal vectors are grouped into cosets and include signal points formed only from the at least two nearest neighbors in each dimension, and wherein each valid potential signal vector is a signal point vector that is part of the signaling scheme; and
   identifying, using the circuitry, one of the cosets based on the valid potential signal vectors to produce an estimate of the received signal vector.

10. The method of claim 9, wherein the at least two nearest neighbors are signal points in a particular dimension of the multi-level modulation scheme that are closest in Euclidean distance to that particular dimension of the received signal vector.

11. The method of claim 9, wherein validating, using the circuitry, each of a plurality of potential signal vectors further comprises:
   reverse mapping each potential signal vector from a channel domain to a coded domain; and
   determining whether each of the mapped potential signal vector in the coded domain satisfies a constraint.

12. The method of claim 11, wherein the constraint is satisfied for one of the mapped potential signal vectors when that mapped potential signal vector includes a particular value for at least one bit.

13. The method of claim 9, wherein the validating further comprises determining whether a particular set of bits in each potential signal vector satisfies a constraint.

14. The method of claim 9, wherein the identifying comprises:
   computing branch metrics based on at least a subset of the set of valid potential signal vectors; and
   determining a path through a trellis diagram using the computed branch metrics, wherein each branch of the path corresponds to one of the cosets.

15. A branch metric computation unit for computing branch metrics for use in decoding a received signal vector based on a first set of nearest neighbors and a second set of nearest neighbors, wherein the second set of nearest neighbors includes signal points further from the received signal vector than corresponding signal points in the first set, and wherein the received signal vector is modulated using a signaling scheme that uses at most half of available signal points vectors in a multi-dimensional modulation scheme, the branch metric computation unit comprising:
   a signal validator to validate each of a plurality of potential signal vectors to produce a first group of valid potential signal vectors, wherein the potential signal vectors include signal points formed only from the first set of nearest neighbors, and wherein the signal validator determines whether each potential signal vector is a signal point vector that is part of the signaling scheme;
   control logic to alter the valid potential signal vectors in the first group to produce a second group of valid potential signal vectors, wherein each valid potential signal vector in the second group includes at least one nearest neighbor in the second set of nearest neighbors; and
   a computation unit to compute a plurality of branch metrics based on the first and second group of valid potential signal vectors.

16. The branch metric computation unit of claim 15, wherein the control logic is configured to change one of the signal points in a valid potential signal vector in the first group to a nearest neighbor in the second set having a same least significant bit as the one of the signal points.

17. The branch metric computation unit of claim 15, wherein the control logic is further configured to:

for each valid potential signal vector in the first group:

replace a first signal point in a first dimension of the valid potential signal vector with a nearest neighbor in the first dimension from the second set to produce a first altered valid potential signal vector;

replace a second signal point in a second dimension of the valid potential signal vector with a nearest neighbor in the second dimension from the second set to produce a second altered valid potential signal vector; and select either the first altered valid potential signal vector or the second altered valid potential signal vector to include in the second group of valid potential signal vectors.

18. The branch metric computation unit of claim 17, wherein the control logic is further configured to:

for each valid potential signal vector in the first group:

compute a first delta difference based on a Euclidean distance between the first signal point and the nearest neighbor in the first dimension from the second set;

compute a second delta difference based on a Euclidean distance between the second signal point and the nearest neighbor in the second dimension from the second set; and select either the first altered valid potential signal vector or the second altered valid potential signal vector to include in the second group of valid potential signal vectors based on the first and second delta differences.

19. The branch metric computation unit of claim 18, wherein the control logic is further configured to:

select the first altered valid potential signal vector to include in the second group of valid potential signal vectors when the first delta distance is smaller than the second delta distance; and select the second altered valid potential signal vector to include in the second group of valid potential signal vectors when the second delta distance is smaller than the first delta distance.

20. The branch metric computation unit of claim 15, wherein the computation unit is configured to:

compute a first group of the plurality of branch metrics based on the first group of valid potential signal vectors; and alter each branch metric in the first group to produce a second group of the plurality of branch metrics.

21. The branch metric computation unit of claim 15, wherein the computation unit comprises:

a Euclidean distance computation unit to compute a Euclidean distance between each valid potential signal vector and the received signal vector, and wherein the branch metrics are based on the Euclidean distances.

22. The branch metric computation unit of claim 21, wherein the Euclidean distance computation unit is further configured to:

calculate delta distances between each nearest neighbor in the first set and its corresponding nearest neighbor in the second set, wherein the corresponding nearest neighbor in the second set has a same value at its least significant bit;

compute the Euclidean distance between each valid potential signal vector in the first group and the received signal vector to produce a first group of Euclidean distances; and add a delta distance to each computed Euclidean distance in the first group to produce Euclidean distances for the second group of valid potential signal vectors.

23. A method of computing branch metrics for use in decoding a received signal vector based on a first set of nearest neighbors and a second set of nearest neighbors, wherein the second set of nearest neighbors includes signal points further from the received signal vector than corresponding signal points in the first set, and wherein the received signal vector is modulated using a signaling scheme that uses at most half of available signal points vectors in a multi-dimensional modulation scheme, the method comprising:

validating, using circuitry, each of a plurality of potential signal vectors to produce a first group of valid potential signal vectors, wherein the potential signal vectors include signal points formed only from the first set of nearest neighbors, and wherein the validating comprises determining whether each potential signal vector is a signal point vector that is part of the signaling scheme;

altering, using the circuitry, the valid potential signal vectors in the first group to produce a second group of valid potential signal vectors, wherein each valid potential signal vector in the second group includes at least one nearest neighbor in the second set of nearest neighbors; and computing, using the circuitry a plurality of branch metrics based on the first and second group of valid potential signal vectors.

24. The method of claim 23, wherein the altering comprises changing one of the signal points in a valid potential signal vector in the first group to a nearest neighbor in the second set having a same least significant bit as the one of the signal points.

25. The method of claim 23, wherein the altering comprises:

for each valid potential signal vector in the first group:

replacing a first signal point in a first dimension of the valid potential signal vector with a nearest neighbor in the first dimension from the second set to produce a first altered valid potential signal vector;

replacing a second signal point in a second dimension of the valid potential signal vector with a nearest neighbor in the second dimension from the second set to produce a second altered valid potential signal vector; and selecting either the first altered valid potential signal vector or the second altered valid potential signal vector to include in the second group of valid potential signal vectors.

26. The method of claim 25, wherein the altering further comprises:

for each valid potential signal vector in the first group:

computing a first delta difference based on a Euclidean distance between the first signal point and the nearest neighbor in the first dimension from the second set; and computing a second delta difference based on a Euclidean distance between the second signal point and the nearest neighbor in the second dimension from the second set, wherein the selecting is based on the first and second delta distances.

27. The method of claim 26, wherein the selecting based on the first and second delta distances comprises:
    selecting the first altered valid potential signal vector to include in the second group of valid potential signal vectors when the first delta distance is smaller than the second delta distance; and
    selecting the second altered valid potential signal vector to include in the second group of valid potential signal vectors when the second delta distance is smaller than the first delta distance.

28. The method of claim 23, wherein the computing, using the circuitry, the plurality of branch metric comprises:
    computing a first group of the plurality of branch metrics based on the first group of valid potential signal vectors; and
    altering each branch metric in the first group to produce a second group of the plurality of branch metrics.

29. The method of claim 23, wherein the computing, using the circuitry, the plurality of branch metrics comprises:
    computing a Euclidean distance between each valid potential signal vector and the received signal vector; and
    computing the plurality of branch metrics based on the Euclidean distances.

30. The method of claim 29, wherein computing the Euclidean distance comprises:
    calculating delta distances between each nearest neighbor in the first set and its corresponding nearest neighbor in the second set, wherein the corresponding nearest neighbor in the second set has a same value at its least significant bit;
    computing the Euclidean distance between each valid potential signal vector in the first group and the received signal vector to produce a first group of Euclidean distances; and
    adding a delta distance to each computed Euclidean distance in the first group to produce Euclidean distances for the second group of valid potential signal vectors.

* * * * *